US011251564B2

(12) United States Patent
Shimomaki et al.

(10) Patent No.: US 11,251,564 B2
(45) Date of Patent: Feb. 15, 2022

(54) CONNECTOR ASSEMBLY

(71) Applicant: Japan Aviation Electronics Industry, Limited, Tokyo (JP)

(72) Inventors: Yuta Shimomaki, Tokyo (JP); Yohei Yokoyama, Tokyo (JP); Kanji Inoue, Tokyo (JP); Takahiro Yamaji, Tokyo (JP); Satoshi Seki, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 0 days.

(21) Appl. No.: 17/037,998

(22) Filed: Sep. 30, 2020

(65) Prior Publication Data

US 2021/0159639 A1 May 27, 2021

(30) Foreign Application Priority Data

Nov. 27, 2019 (JP) ............................ JP2019-213901

(51) Int. Cl.
*H01R 13/62* (2006.01)
*H01R 13/627* (2006.01)
(Continued)

(52) U.S. Cl.
CPC ......... *H01R 13/6272* (2013.01); *H01R 12/75* (2013.01); *H01R 13/6582* (2013.01); *H01R 13/6594* (2013.01)

(58) Field of Classification Search
CPC ........... H01R 13/6272; H01R 13/6582; H01R 12/75; H01R 13/6594; H01R 12/724; H01R 13/6583
(Continued)

(56) References Cited

U.S. PATENT DOCUMENTS 4,993,803 A * 2/1991 Suverison ............ G02B 6/3817 250/227.11
5,180,312 A * 1/1993 Martin ............... H01R 13/6275 439/357
(Continued)

FOREIGN PATENT DOCUMENTS

CN 208045870 U 11/2018
CN 208986300 U 6/2019
(Continued)

*Primary Examiner* — Abdullah A Riyami
*Assistant Examiner* — Nelson R. Burgos-Guntin
(74) *Attorney, Agent, or Firm* — Collard & Roe, P.C.

(57) ABSTRACT

A connector assembly comprises a first connector and a second connector connectable to each other. The first connector comprises first terminals each having a first contact portion, a first shell having a first mating portion and a first engagement member formed with an engagement recess. The second connector comprises second terminals each having a second contact portion, a second shell having a second mating portion and a second engagement member having an engagement projection. Under a connected state where the first connector and the second connector are connected to each other, the first mating portion and the second mating portion entirely enclose contact areas in a perpendicular plane (YZ-plane) at which the first contact portions are in contact with the second contact portions. Under the connected state, the engagement projection and the engagement recess are engaged with each other to lock the connected state.

11 Claims, 15 Drawing Sheets

(51) Int. Cl.
*H01R 13/6582* (2011.01)
*H01R 12/75* (2011.01)
*H01R 13/6594* (2011.01)

(58) Field of Classification Search
USPC .......................................... 439/78, 352, 353
See application file for complete search history.

(56) References Cited

U.S. PATENT DOCUMENTS

| | | | | | |
|---|---|---|---|---|---|
| 7,241,153 | B2 * | 7/2007 | He | H01R 13/506 | 439/148 |
| 7,491,095 | B1 * | 2/2009 | Huang | H01R 12/716 | 439/358 |
| 7,703,987 | B2 * | 4/2010 | Kramer | G02B 6/3825 | 385/55 |
| 7,828,579 | B2 * | 11/2010 | Huang | H01R 13/6275 | 439/352 |
| 8,062,051 | B2 * | 11/2011 | Ngo | H01R 13/6275 | 439/352 |
| 8,235,744 | B1 * | 8/2012 | Liptak | H01R 13/633 | 439/352 |
| 8,287,299 | B2 * | 10/2012 | Ray | H01R 13/6273 | 439/353 |
| 8,435,062 | B2 * | 5/2013 | Lange | H01R 13/6335 | 439/350 |
| 8,506,331 | B2 * | 8/2013 | Wu | H01R 13/6658 | 439/607.18 |
| 8,529,284 | B1 * | 9/2013 | Smith | H01R 13/6272 | 439/352 |
| 8,535,081 | B2 * | 9/2013 | Chikano | H01R 13/6273 | 439/352 |
| 8,556,646 | B2 * | 10/2013 | Kappla | G02B 6/4261 | 439/352 |
| 8,905,777 | B2 * | 12/2014 | Zhu | H01R 13/62 | 439/352 |
| 9,614,329 | B2 * | 4/2017 | Chen | H01R 13/642 | |
| 10,879,637 | B2 * | 12/2020 | Chung | H01R 13/424 | |
| 2005/0282424 | A1 * | 12/2005 | Huang | H01R 13/6275 | 439/353 |
| 2007/0141888 | A1 * | 6/2007 | Toda | H01R 12/725 | 439/353 |
| 2009/0203237 | A1 * | 8/2009 | Demonica | H05K 1/18 | 439/78 |
| 2009/0221161 | A1 * | 9/2009 | Zhu | H01R 27/02 | 439/78 |
| 2010/0035459 | A1 * | 2/2010 | Briant | H01R 13/6275 | 439/352 |
| 2010/0112845 | A1 * | 5/2010 | Lam | H01R 13/6275 | 439/352 |
| 2012/0071012 | A1 * | 3/2012 | Zheng | H01R 12/724 | 439/78 |
| 2012/0156900 | A1 * | 6/2012 | Wu | H01R 13/506 | 439/76.1 |
| 2012/0190223 | A1 * | 7/2012 | Wu | H01R 13/633 | 439/152 |
| 2012/0329298 | A1 * | 12/2012 | Hardy | H01R 13/502 | 439/78 |
| 2013/0178100 | A1 * | 7/2013 | Nagata | H01R 13/648 | 439/607.35 |
| 2014/0302694 | A1 * | 10/2014 | Qiao | H01R 13/6275 | 439/78 |
| 2014/0322953 | A1 * | 10/2014 | Katayanagi | H01R 13/6582 | 439/353 |
| 2014/0357103 | A1 * | 12/2014 | Little | H01R 12/724 | 439/78 |
| 2015/0288097 | A1 * | 10/2015 | Yen | H01R 13/6275 | 439/352 |
| 2015/0349439 | A1 * | 12/2015 | Sawairi | H01R 12/675 | 439/78 |
| 2016/0020549 | A1 * | 1/2016 | Chen | H01R 13/5219 | 439/78 |
| 2016/0064873 | A1 * | 3/2016 | Bucher | H01R 13/6658 | 385/88 |
| 2016/0156116 | A1 * | 6/2016 | Kurachi | H01R 13/6581 | 439/78 |
| 2021/0159639 | A1 * | 5/2021 | Shimomaki | H01R 13/6272 | |

FOREIGN PATENT DOCUMENTS

| | | |
|---|---|---|
| JP | 2004-335275 A | 11/2004 |
| JP | 2010-073373 A | 4/2010 |

* cited by examiner

CONNECTOR ASSEMBLY

CROSS REFERENCE TO RELATED APPLICATIONS

This application is based on and claims priority under 35 U.S.C. § 119 to Japanese Patent Application No. JP 2019-213901 filed Nov. 27, 2019, the content of which is incorporated herein in its entirety by reference.

BACKGROUND OF THE INVENTION

This invention relates to a connector assembly comprising two connectors connectable to each other.

For example, this type of connector assembly is disclosed in JP2004-335275 (Patent Document 1), the content of which is incorporated herein by reference.

Referring to FIG. 29, Patent Document 1 discloses a connector assembly 90 which comprises a male connector (first connector) 92 and a female connector (second connector) 95 connectable to each other. The first connector 92 has a connection portion (first mating portion) 94. The first mating portion 94 is formed with two lock holes 942. The second connector 95 has a connection portion (second mating portion) 96 and two lock hooks 98. The second mating portion 96 is formed with two passing holes 962. Under a connected state where the first connector 92 and the second connector 95 are connected to each other, the first mating portion 94 is received in the second mating portion 96 so that the lock holes 942 are located just under the passing holes 962, respectively. Under the connected state, the lock hooks 98 are engaged with the lock holes 942 through the passing holes 962, respectively, so that the connected state is locked. Thus, the connector assembly 90 has a lock mechanism which is formed of the lock holes 942, the passing holes 962 and the lock hooks 98.

When the lock mechanism disclosed in Patent Document 1 is applied to a connector assembly, the connector assembly under the connected state is formed with two holes each formed of one of the lock holes and one of the passing holes. Such holes are not preferable since they might cause electromagnetic interference (EMI). In particular, the lock mechanism of Patent Document 1 is not suitable for a connector assembly which transmits high-speed signals.

SUMMARY OF THE INVENTION

It is therefore an object of the present invention to provide a connector assembly which has a lock mechanism and is provided with a structure for preventing EMI.

An aspect of the present invention provides a connector assembly comprising a first connector and a second connector. The first connector and the second connector are connectable to each other along a connection direction. The first connector comprises a first holding member, a plurality of first terminals, a first shell and a first engagement member. The first terminals are held by the first holding member. Each of the first terminals has a first contact portion. The first shell has a first mating portion. The first mating portion covers, at least in part, the first contact portions in a perpendicular plane perpendicular to the connection direction. The first engagement member is fixed to the first shell. The first engagement member is formed with an engagement recess. The engagement recess is located outward of the first shell in a perpendicular direction perpendicular to the connection direction. The second connector comprises a second holding member, a plurality of second terminals, a second shell and a second engagement member. The second terminals are held by the second holding member. Each of the second terminals has a second contact portion. The second shell has a second mating portion. The second mating portion covers, at least in part, the second contact portions in the perpendicular plane. The second engagement member covers, at least in part, the second mating portion in the perpendicular plane. The second engagement member has an engagement projection and an engagement support portion. The engagement projection is supported by the engagement support portion to be movable in the perpendicular direction. The engagement projection is located outward of the second shell in the perpendicular direction and projects toward the second shell. Under a connected state where the first connector and the second connector are connected to each other, the first contact portions are in contact with the second contact portions at contact areas, respectively. Under the connected state, the first mating portion and the second mating portion are fit to each other to entirely enclose the contact areas in the perpendicular plane. Under the connected state, the engagement projection and the engagement recess are engaged with each other to lock the connected state.

According to an aspect of the present invention, under the connected state where the first connector and the second connector are connected to each other, the engagement projection of the first connector and the engagement recess of the second connector are engaged with each other to lock the connected state. Thus, the connector assembly according to an aspect of the present invention has a lock mechanism which is formed of the engagement projection and the engagement recess. Moreover, when the first connector and the second connector are under the connected state, the first mating portion and the second mating portion entirely enclose the contact areas, at each of which the first terminal and the second terminal are in contact with each other, in the perpendicular plane. This structure prevents the connector assembly from being formed of a hole which might cause EMI. Thus, an aspect of the present invention provides a connector assembly which has a lock mechanism and is provided with a structure for preventing EMI.

In general, a projecting portion which projects outward from a member tends to cause damage to the member. However, according to an aspect of the present invention, the first engagement member fixed to the first shell does not need to be provided with any projecting portion. In addition, although the engagement projection (projecting portion) of the second engagement member is located outward of the second shell, it projects toward the second shell. Thus, the projecting portion of the second engagement member projects toward the inside space of the second connector. The structures described above according to an aspect of the present invention contribute to lower the possibility of damaging the connector assembly.

An appreciation of the objectives of the present invention and a more complete understanding of its structure may be had by studying the following description of the preferred embodiment and by referring to the accompanying drawings.

Figure 1:
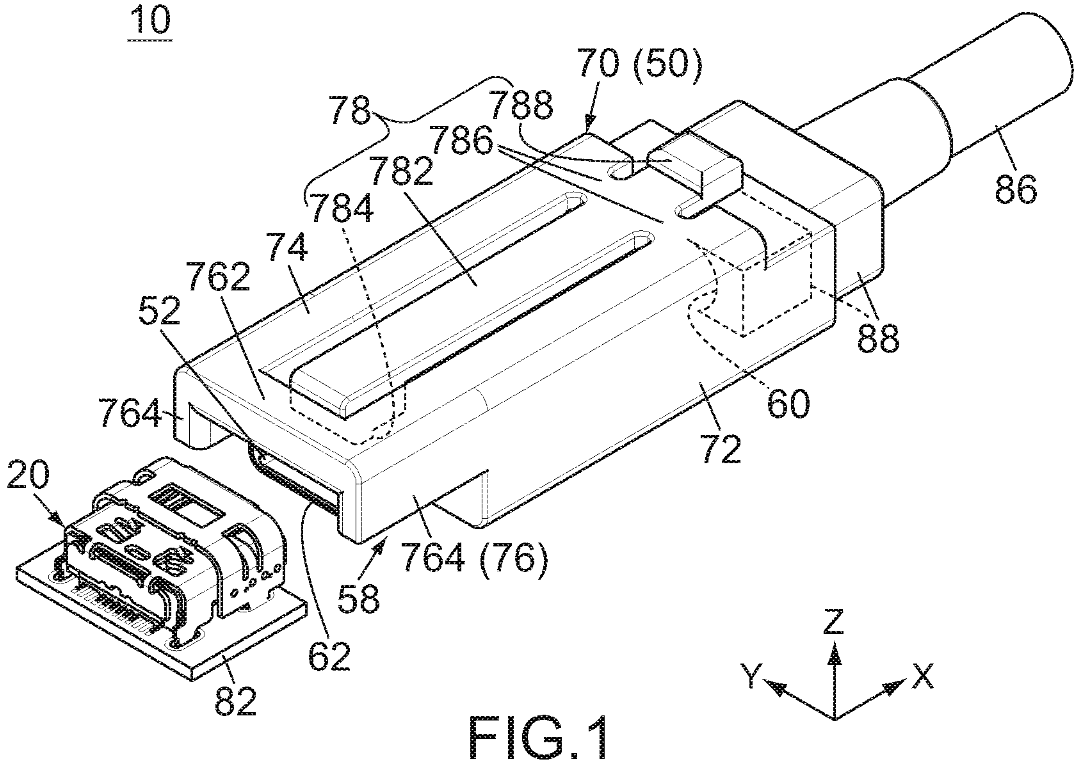
FIG. 1 is a perspective view showing a connector assembly according to a first embodiment of the present invention, wherein a first connector and a second connector of the connector assembly are under a separated state where they are separated from each other, the first connector is mounted on a board, the second connector is connected to a cable, and outlines of hidden parts of the second connector are partially illustrated with dashed line.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

First Embodiment

Figure 2:
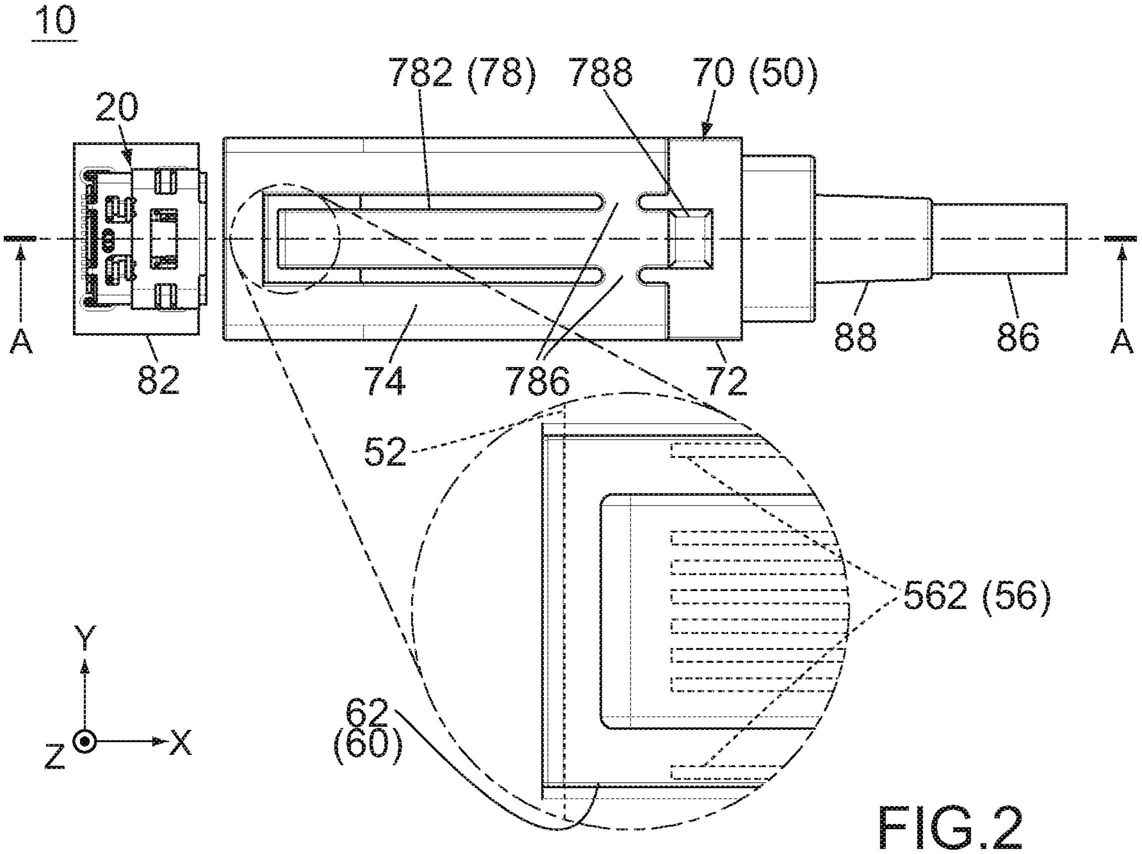
FIG. 2 is a top view showing the connector assembly of FIG. 1, wherein a part of the connector assembly enclosed by two-dot chain line is enlarged and illustrated, and an outline of a hidden second holding member and outlines of hidden second terminals are partially illustrated by dashed line in the enlarged view.

As shown in FIGS. 1 and 2, a connector assembly 10 according to the first embodiment of the present invention comprises a first connector 20 and a second connector 50. The first connector 20 is a receptacle. The first connector 20 is mounted on a circuit board (board) 82 when used. The second connector 50 is a plug. The second connector 50 is connected to a cable 86 when used. Thus, in the present embodiment, the first connector 20 is an on-board receptacle connector, and the second connector 50 is a cable plug connector. In particular, the first connector 20 is a so-called angle-type receptacle. However, the present invention is not limited thereto but is applicable to various connector assemblies. For example, the first connector 20 may be a plug, and the second connector 50 may be a receptacle.

Figure 3:
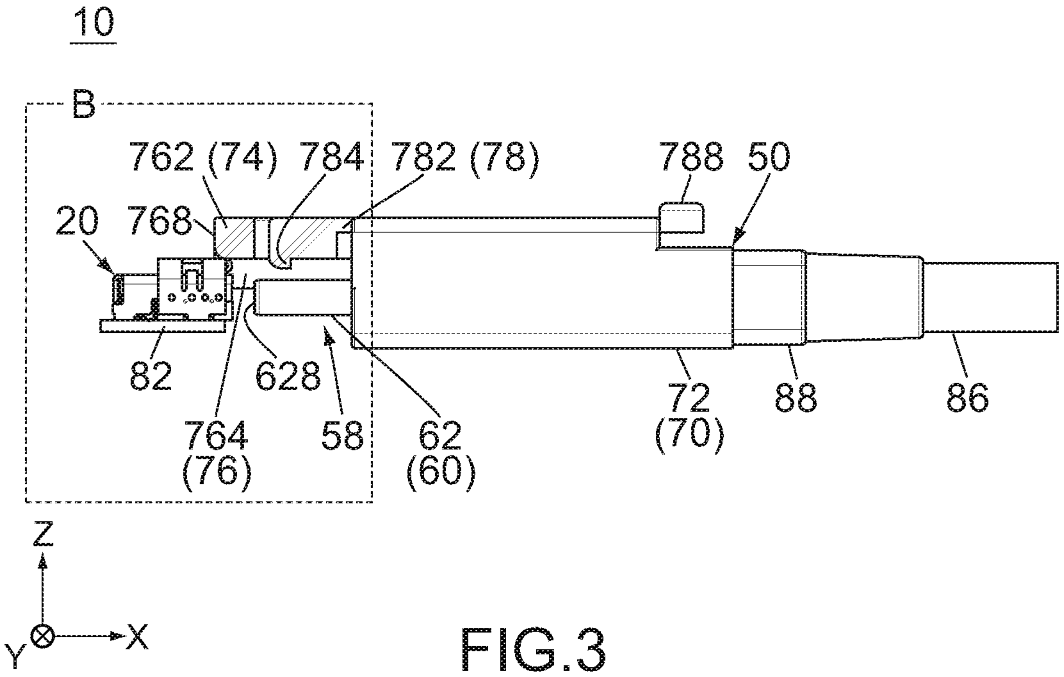
FIG. 3 is a side view showing the connector assembly of FIG. 2, wherein the first connector and the second connector are during an operation in which they are connected to each other, and the second connector is partially cut away along line A-A.
Figure 4:
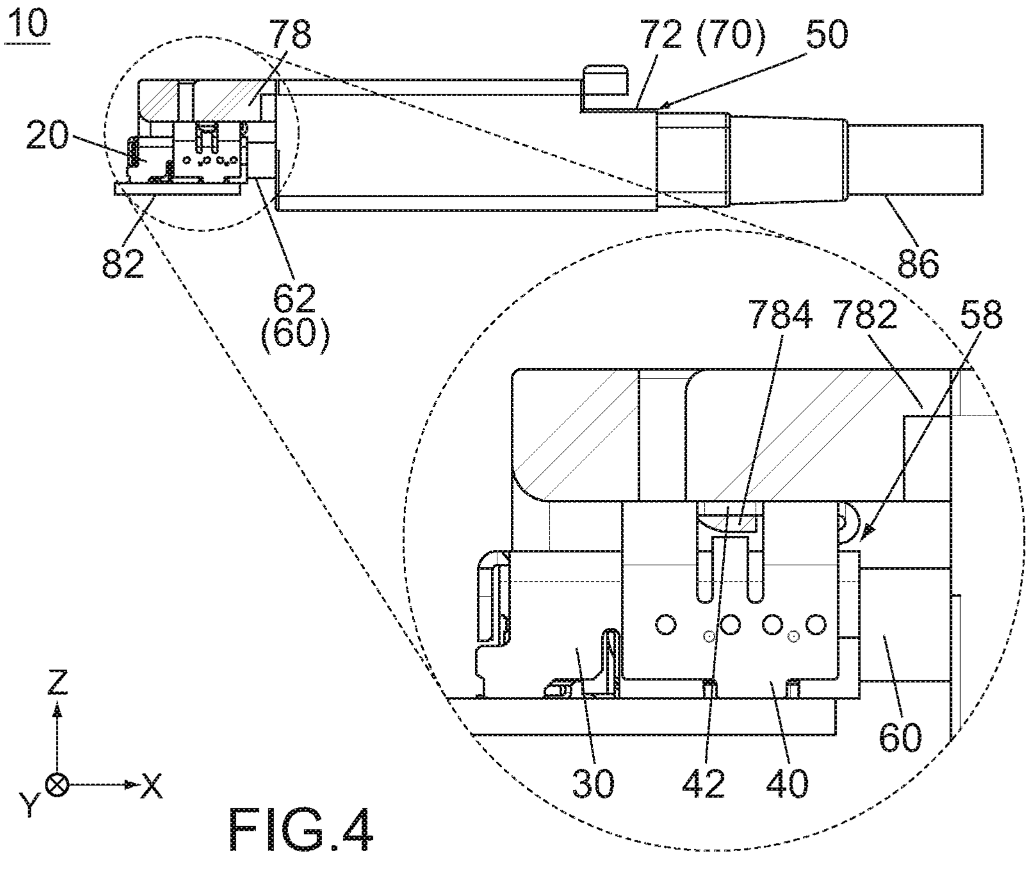
FIG. 4 is a side view showing the connector assembly of FIG. 2, wherein the first connector and the second connector are under a connected state where they are connected to each other, the second connector is partially cut away along line A-A, and a part of the connector assembly enclosed by dashed line is enlarged and illustrated.

Referring to FIGS. 3 and 4, the first connector 20 and the second connector 50 are connectable to each other along a connection direction (front-rear direction: X-direction). The first connector 20 and the second connector 50 shown in FIG. 3 are under a separated state where they are separated from each other. The second connector 50 under the separated state is located forward of the first connector 20 and faces the positive X-side of the first connector 20. When the second connector 50 under the separated state is moved rearward, or toward the first connector 20 in the negative X-direction, the first connector 20 and the second connector 50 take a connected state, or a state shown in FIG. 4, where they are connected to each other. Under the connected state, the first connector 20 and the second connector 50 are electrically connected with each other, so that an electronic device (not shown) including the board 82 and another electronic device (not shown) connected to the cable 86 are electrically connected with each other.

Hereafter, explanation will be made about the structure of the first connector 20.

Figure 5:
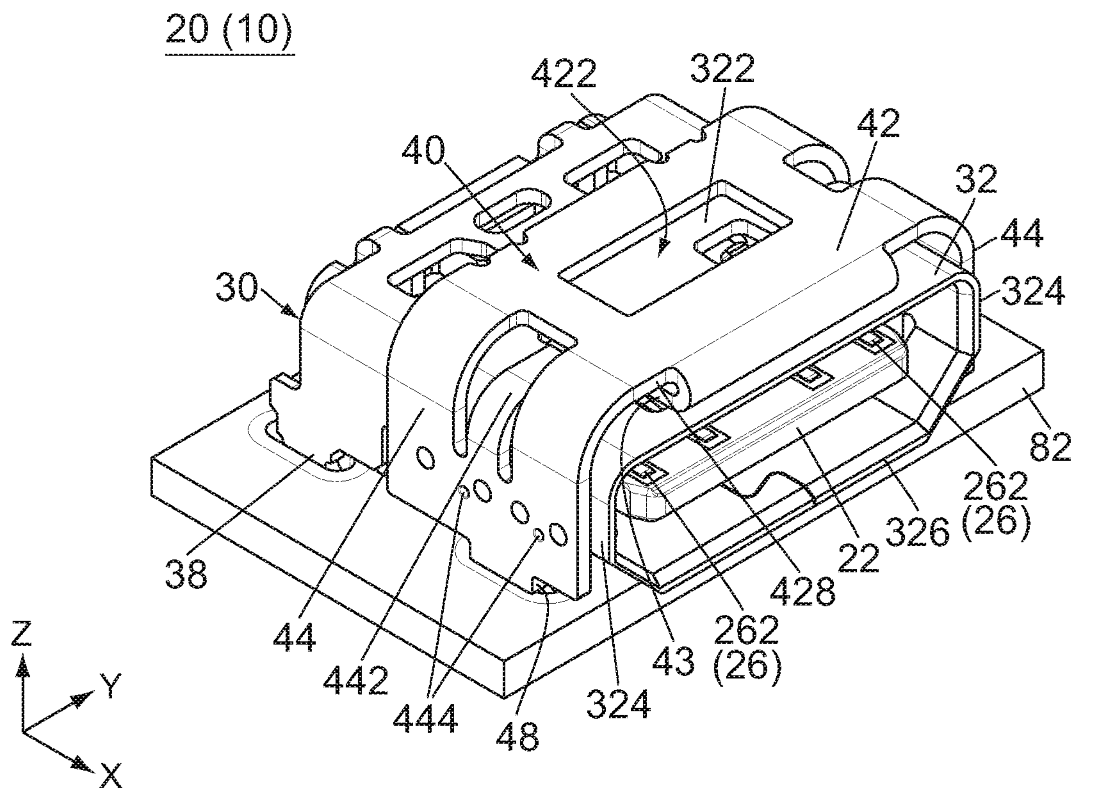
FIG. 5 is a perspective view showing the first connector of the connector assembly of FIG. 1.
Figure 6:
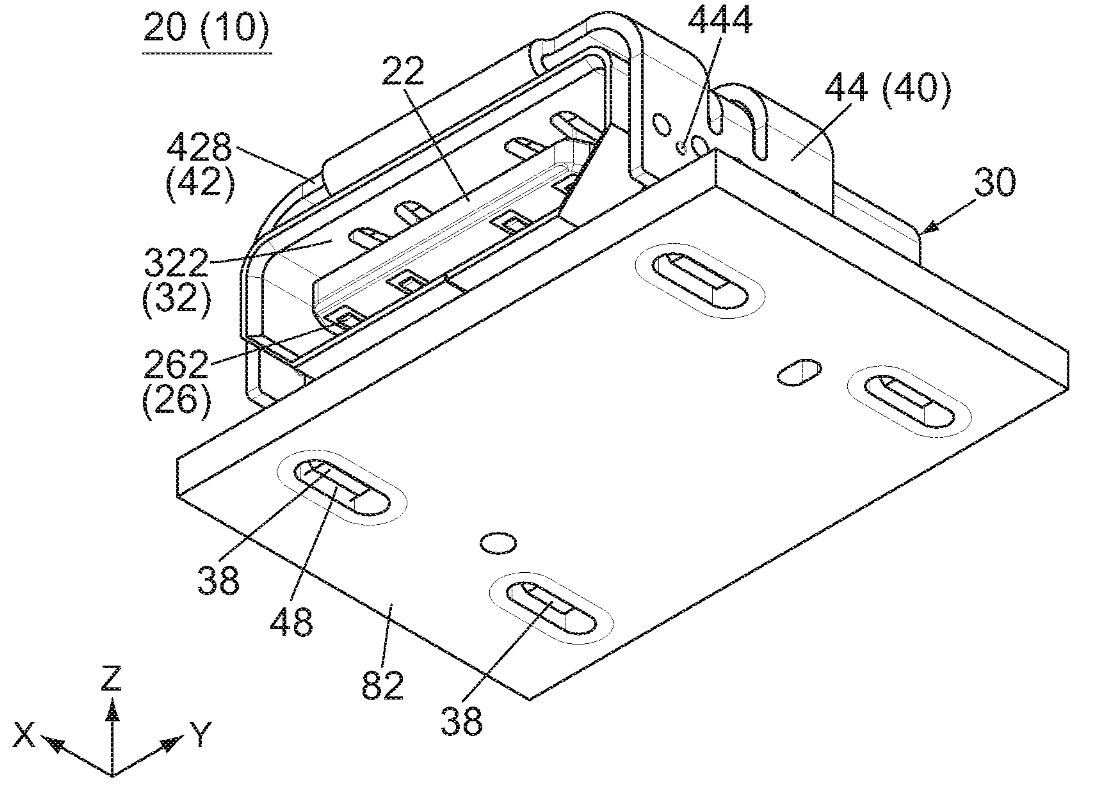
FIG. 6 is another perspective view showing the first connector of FIG. 5.

Referring to FIGS. 5 and 6, the first connector 20 of the present embodiment comprises a first holding member 22 made of insulator, a plurality of first terminals 26 each made of conductor, a first shell 30 made of conductor and a first engagement member 40 made of material having high strength. All the aforementioned members of the present embodiment are formed separately from each other. For example, the first engagement member 40 is a member other than the first shell 30. The first connector 20 of the present embodiment is formed by combining the aforementioned members. However, the present invention is not limited thereto. For example, the first engagement member 40 may be formed integrally with the first shell 30. In other words, each of the first shell 30 and the first engagement member 40 may be a part of a single member. Instead, the first connector 20 may further comprise the other member in addition to the aforementioned members.

According to the present embodiment, each of the first terminals 26, the first shell 30 and the first engagement member 40 is made of metal. In detail, each of these members is a single metal plate with bends. However, the present invention is not limited thereto. For example, the first shell 30 may be formed of a plurality of members joined to each other.

Figure 7:
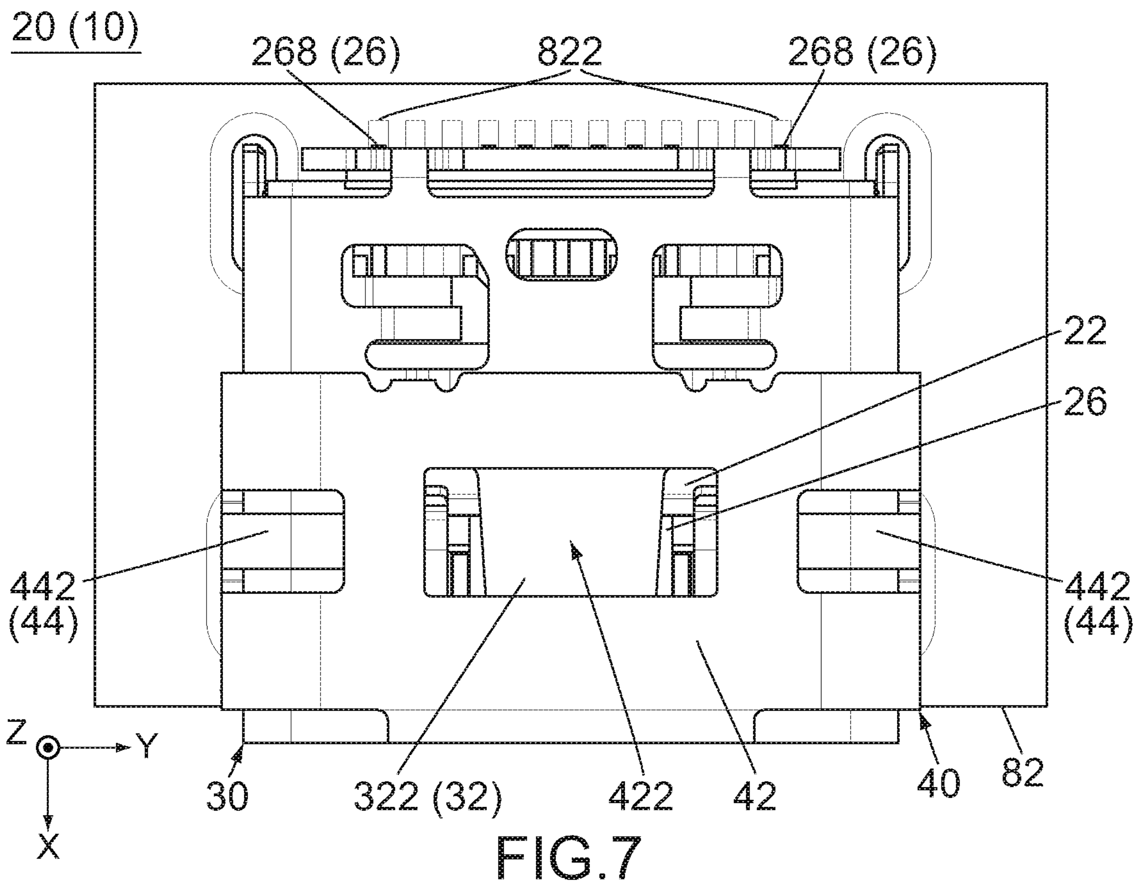
FIG. 7 is a top view showing the first connector of FIG. 5.

Referring to FIG. 7, the first terminals 26 are held by the first holding member 22. Each of the first terminals 26 has a first fixed portion 268. In the present embodiment, when the first connector 20 is mounted on the board 82, each of the first fixed portions 268 is fixed on and connected to a conductive pad 822 of the board 82 via soldering, etc.

Referring to FIGS. 5 and 6, each of the first terminals 26 has a first contact portion 262. The first contact portions 262 are electrically connected with the second connector 50 (see FIG. 4) under the connected state (see FIG. 4). The first contact portions 262 of the present embodiment are divided into two rows in a perpendicular direction (upper-lower direction: Z-direction) perpendicular to the X-direction. The two rows of the first contact portions 262 are arranged on opposite surfaces, namely an upper surface (positive Z-side surface) and a lower surface (negative Z-side surface), of a plate-like portion of the first holding member 22 in the Z-direction, respectively. The first contact portions 262 of each row are arranged in a predetermined direction (lateral direction: Y-direction) perpendicular to both the X-direction and the Z-direction. The first terminals 26 of the present embodiment have the aforementioned structure and are arranged as described above. However, the structure and the arrangement of the first terminals 26 according to the present invention are not specifically limited.

Figure 8:
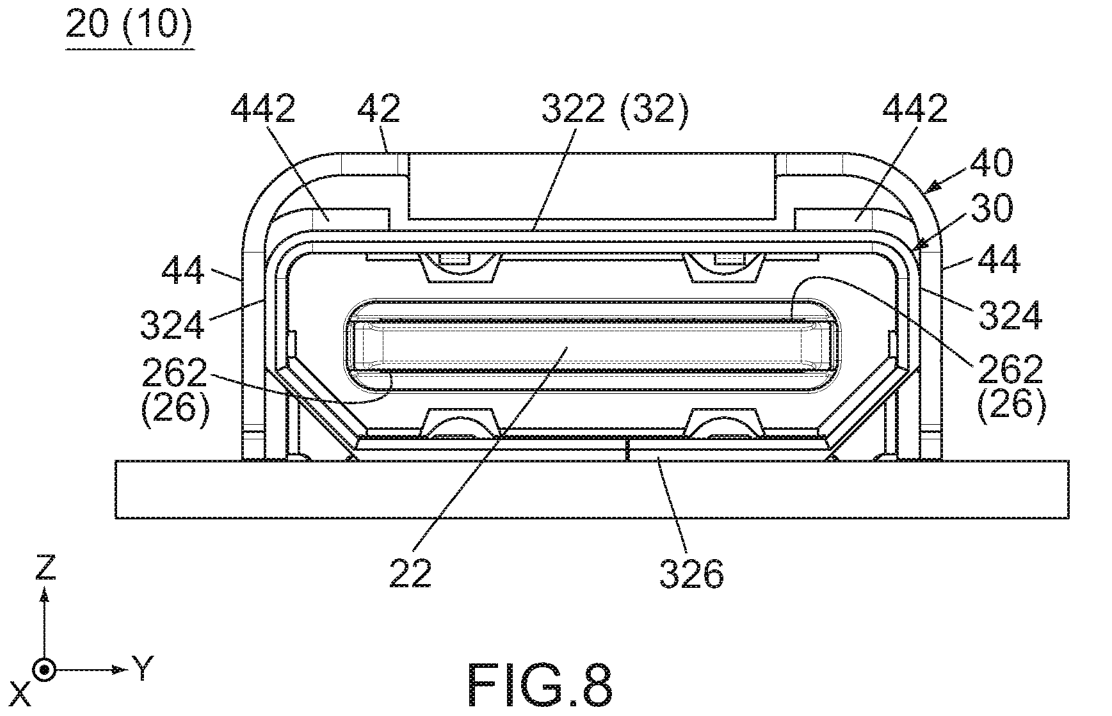
FIG. 8 is a front view showing the first connector of FIG. 5.

Referring to FIGS. 5 and 8, the first shell 30 of the present embodiment is attached to the first holding member 22. The first shell 30 has a first mating portion 32. The first mating portion 32 has a main plate 322, two side plates 324 and an opposite plate 326. The main plate 322 and the opposite plate 326 are located at opposite sides, namely an upper side (positive Z-side) and a lower side (negative Z-side), of the first mating portion 32 in the Z-direction, respectively. Each of the main plate 322 and the opposite plate 326 extends along a predetermined plane (XY-plane) perpendicular to the Z-direction. The side plates 324 are located at opposite sides of the first mating portion 32 in the Y-direction, respectively. Each of the side plates 324 couples the main plate 322 and the opposite plate 326 to each other in the Z-direction. The first mating portion 32 of the present embodiment has the aforementioned structure. However, the present invention is not limited thereto, but the structure of the first mating portion 32 can be variously modified.

Figure 10:
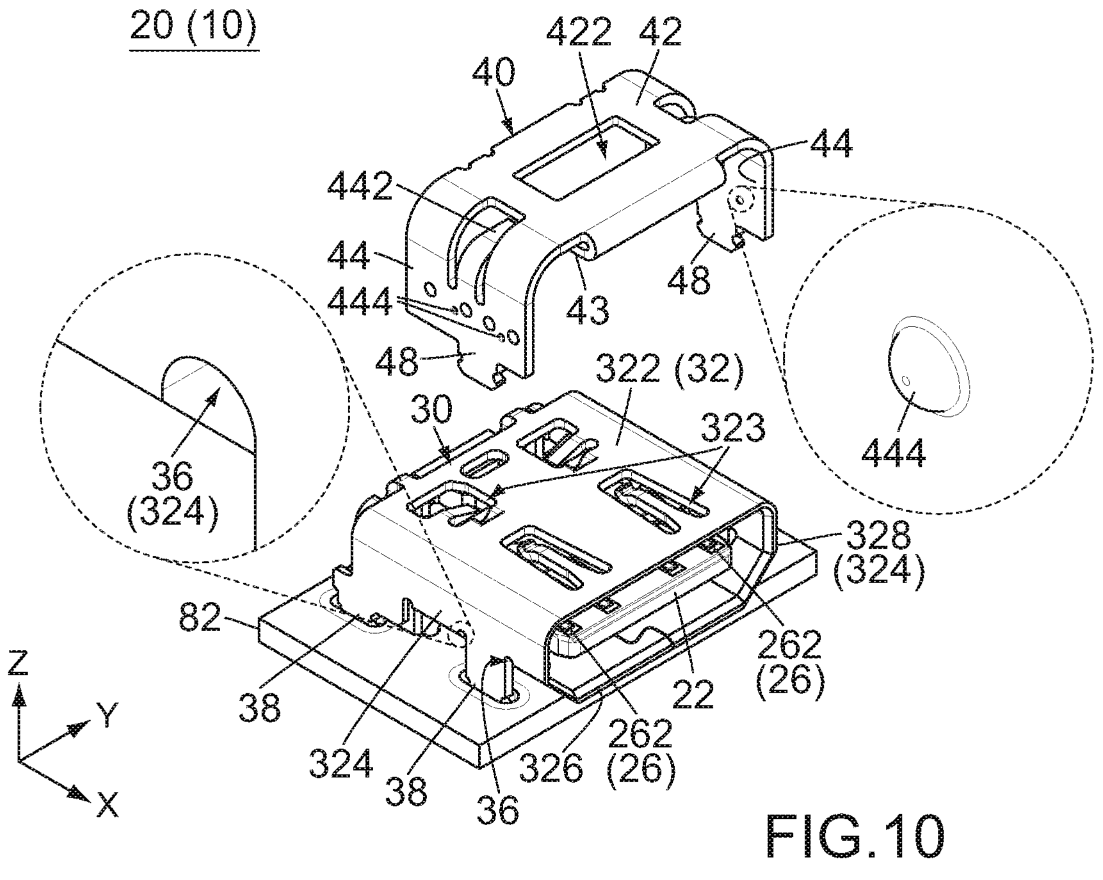
FIG. 10 is an exploded, perspective view showing the first connector of FIG. 5, wherein a part of a first shell of the first connector enclosed by dashed line and a part of a first engagement member of the first connector enclosed by dashed line are enlarged and illustrated.

The first mating portion 32 of the present embodiment encloses most of the first holding member 22 in a perpendicular plane (YZ-plane) perpendicular to the X-direction. In detail, the main plate 322 and the opposite plate 326 cover opposite sides of the first holding member 22, respectively, in the Z-direction. The two side plates 324 cover opposite sides of the first holding member 22, respectively, in the Y-direction. Thus, the first mating portion 32 covers the first contact portions 262, which are arranged on the first holding member 22, in the YZ-plane. As shown in FIG. 10, the main plate 322 of the present embodiment is formed with a plurality of holes 323. The thus-formed first mating portion 32 does not entirely cover the first contact portions 262 in the YZ-plane. However, the present invention is not limited thereto, but the first mating portion 32 may entirely cover the first contact portions 262 in the YZ-plane. Thus, the first mating portion 32 should cover, at least in part, the first contact portions 262 in the YZ-plane.

Figure 9:
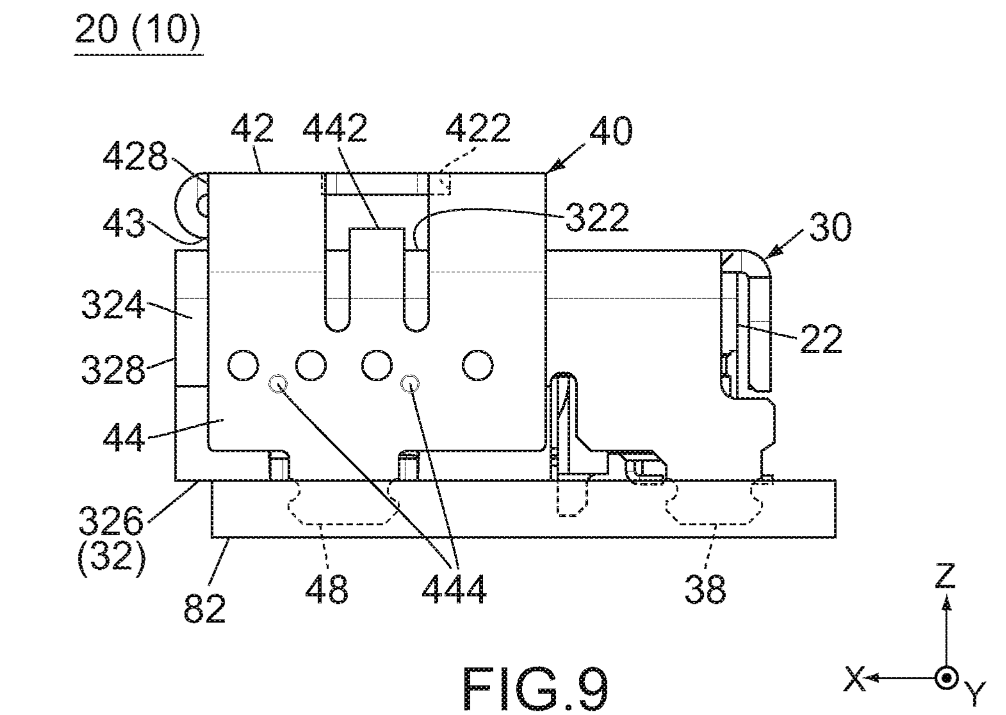
FIG. 9 is a side view showing the first connector of FIG. 5, wherein outlines of hidden parts of the first connector are illustrated with dashed line.

As shown in FIGS. 9 and 10, the first shell 30 of the present embodiment has a plurality of fixed portions 38. Each of the side plates 324 of the present embodiment is provided with two of the fixed portions 38. Each of the fixed portions 38 extends downward, or extends along the negative Z-direction, from the side plate 324 so as to be away from the main plate 322 and the opposite plate 326 along the Z-direction. According to the present embodiment, when the first connector 20 is mounted on the board 82, each of the fixed portions 38 is press-fit into and fixed to the board 82 and is connected to a ground pattern (not shown). The first mating portion 32 of the thus-arranged first shell 30 is located above the board 82. The first mating portion 32 has an end 328 which is a front end (positive X-side end) thereof. The end 328 projects beyond an edge of the board 82 in the X-direction. However, the present invention is not limited thereto, but the arrangement of the first shell 30 on the board 82 can be variously modified.

Referring to FIGS. 5 and 8, the first engagement member 40 of the present embodiment is attached to the first shell 30. The first engagement member 40 has a flat-plate portion 42 and two arms 44. The flat-plate portion 42 extends along the XY-plane and has a roughly rectangular shape in the XY-plane. In other words, the flat-plate portion 42 of the present embodiment is a rectangular plate perpendicular to the Z-direction. The arms 44 are located at opposite sides of the first engagement member 40 in the Y-direction, respectively. The arms 44 extend along the Z-direction in parallel to each other from opposite ends of the flat-plate portion 42 in the Y-direction, respectively. The first engagement member 40 of the present embodiment has the aforementioned structure. However, the present invention is not limited thereto, but the structure of the first engagement member 40 can be variously modified. For example, each of the arms 44 may be provided as necessary. The flat-plate portion 42 may be slightly oblique to the Z-direction. Thus, the flat-plate portion 42 may intersect with the Z-direction.

The first engagement member 40 of the present embodiment partially encloses the first shell 30 in the YZ-plane. In detail, the flat-plate portion 42 covers the main plate 322 of the first shell 30 in the Z-direction with a distance therebetween. The two arms 44 cover the two side plates 324 of the first shell 30, respectively, in the Y-direction. Thus, the first engagement member 40 of the present embodiment is arranged to partially cover the first shell 30. However, the present invention is not limited thereto, but the arrangement of the first engagement member 40 can be variously modified.

As shown in FIGS. 9 and 10, the first engagement member 40 of the present embodiment has a plurality of fixed portions 48. Each of the arms 44 of the present embodiment is provided with one of the fixed portions 48. Each of the fixed portions 48 extends from the arm 44 along the Z-direction so as to be away from the flat-plate portion 42. Referring to FIGS. 5, 6 and 9, when the first connector 20 of the present embodiment is mounted on the board 82, each of the fixed portions 48 is press-fit into and fixed to the board 82 together with one of the fixed portions 38 of the first shell 30. The flat-plate portion 42 has an end 428 which is a front end (positive X-side end) thereof. The end 428 of the flat-plate portion 42 of the thus-arranged first engagement member 40 is located at a position same as that of the edge of the board 82 in the X-direction. However, the present invention is not limited thereto, but the arrangement of the first engagement member 40 on the board 82 can be variously modified. Moreover, the first engagement member 40 may be attached not to the board 82 but only to the first shell 30.

As shown in FIGS. 5, 7 and 9, the first engagement member 40 is formed with an engagement recess 422. The engagement recess 422 of the present embodiment is formed in the flat-plate portion 42. The engagement recess 422 is located outward of the first shell 30 in the Z-direction. In detail, the flat-plate portion 42 is apart from the first mating portion 32, which includes the main plate 322, of the first shell 30 in the Z-direction, so that the engagement recess 422 is apart from the main plate 322 in the Z-direction.

As shown in FIGS. 5 and 9, the first engagement member 40 of the present embodiment has a folded portion 43. The folded portion 43 has an arcuate portion and a flat-plate portion. The arcuate portion of the folded portion 43 extends from the end 428 of the flat-plate portion 42 toward the main plate 322 of the first mating portion 32 while having a semi-circular shape in the XZ-plane. The flat-plate portion of the folded portion 43 extends from the arcuate portion along the X-direction so as to be away from the end 428 and is located between the flat-plate portion 42 and the main plate 322 in the Z-direction. Thus, in the Z-direction, the flat-plate portion 42 and the engagement recess 422 are apart from the main plate 322 of the first mating portion 32 by a distance dimension larger than a thickness dimension of the folded portion 43. The flat-plate portion 42 of the present embodiment is reinforced by the folded portion 43 to be hardly bent. Therefore, the engagement recess 422 is hardly moved in the Z-direction. However, the present invention is not limited thereto, but the folded portion 43 may be provided as necessary.

As shown in FIGS. 5, 7 and 9, each of the arms 44 of the present embodiment is partially cut so as to form a spring piece 442. Each of the spring pieces 442 extends inward in the Y-direction from an inner edge of the cut of the arm 44 and is resiliently deformable.

As shown in FIG. 10, the first shell 30 of the present embodiment has a plurality of inner positioning portions (openings) 36. The first engagement member 40 of the present embodiment has a plurality of outer positioning portions 444 which correspond to the inner positioning portions 36, respectively. Each of the inner positioning portions 36 is an opening formed in the first mating portion 32 and opens inward and outward from the first mating portion 32 in the YZ-plane. Each of the outer positioning portions 444 projects inward in the YZ-plane.

Referring to FIGS. 5 and 10, each of the inner positioning portions 36 and the corresponding outer positioning portion 444 are securely combined to each other, so that the first engagement member 40 is positioned and fixed to the first shell 30. More specifically, the outer positioning portions 444 are received in the inner positioning portions 36, respectively, and close, at least in part, the inner positioning portions 36, respectively. The two arms 44 of the first engagement member 40 sandwich the first mating portion 32 in the Y-direction. Each of the spring pieces 442 of the arms 44 is pressed against the main plate 322 of the first mating portion 32 while being resiliently deformed. When the first connector 20 is mounted on the board 82, the arms 44 and the board 82 sandwich the first mating portion 32 in the Z-direction.

Referring to FIG. 10, according to the present embodiment, each of the inner positioning portions 36 is a recess formed in the side plate 324 of the first mating portion 32, and each of the outer positioning portions 444 is a projection formed on the arm 44. However, the present invention is not limited thereto. For example, the structure and the arrangement of the inner positioning portions 36 and the outer positioning portions 444 are not specifically limited, provided that the inner positioning portions 36 are provided so as to correspond to the outer positioning portions 444, respectively.

According to the present embodiment, the first engagement member 40 is further securely fixed to the first shell 30 via welding, etc. after the inner positioning portions 36 and the outer positioning portions 444 are combined, respectively. However, the present invention is not limited thereto, but the first engagement member 40 may be welded to the first shell 30 as necessary.

Hereafter, explanation will be made about the structure of the second connector 50.

Referring to FIGS. 1 and 2, the second connector 50 of the present embodiment comprises a second holding member 52 made of insulator, a plurality of second terminals 56 each made of conductor, a second shell 60 made of conductor and a second engagement member 70 made of insulator. However, the present invention is not limited thereto. For example, the second connector 50 may further comprise the other member in addition to the aforementioned members. Moreover, the second engagement member 70 may be made of metal.

Referring to FIG. 1, the second connector 50 of the present embodiment is attached to the cable 86 protected by a protection member 88 made of insulator. When the protection member 88 is molded, the second shell 60 and the second engagement member 70 are joined to the protection member 88, so that the second engagement member 70 is positioned to the second shell 60. However, the connection method of the present invention by which the second connector 50 is connected to the cable 86 is not specifically limited.

Referring to FIG. 2, according to the present embodiment, each of the second terminals 56 and the second shell 60 is made of metal. In detail, each of these members is a single metal plate with bends. However, the present invention is not limited thereto. For example, the second shell 60 may be formed of a plurality of members joined to each other.

Figure 16:
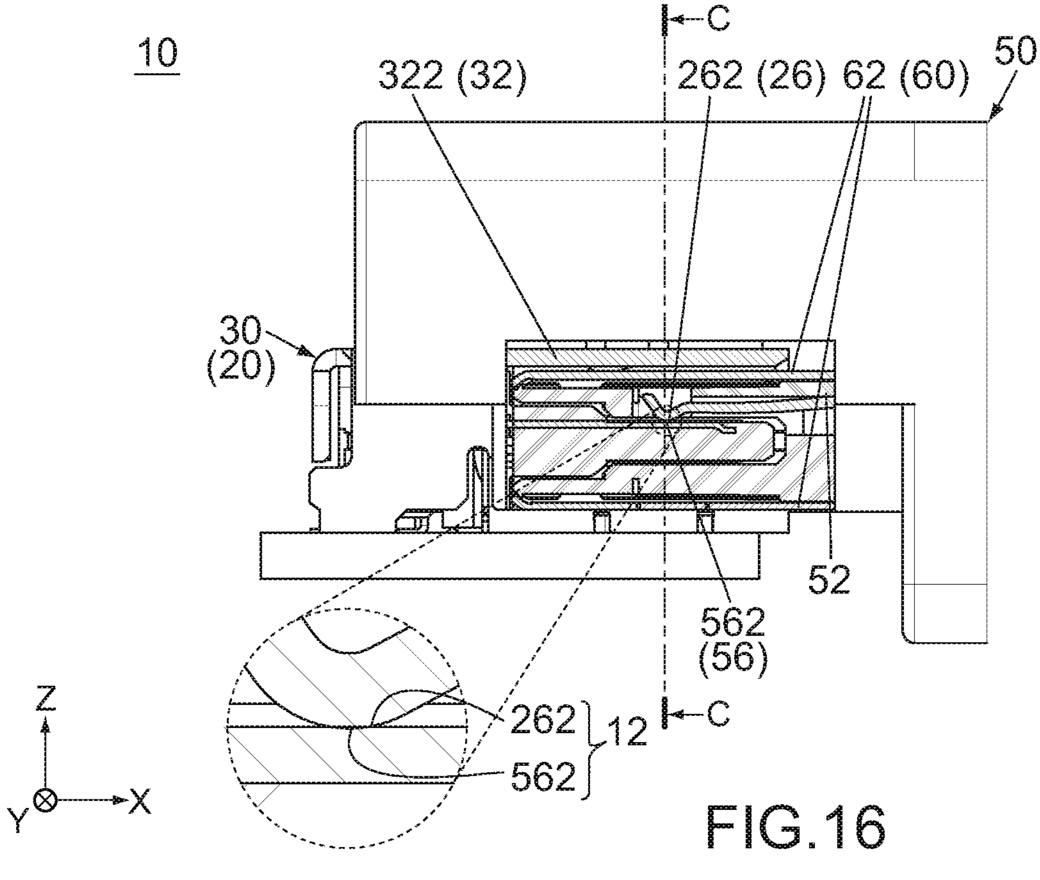
FIG. 16 is another side view showing the connector assembly of FIG. 15, wherein the first connector and the second connector are partially cut away.

Referring to FIGS. 2 and 16, the second terminals 56 are held by the second holding member 52. Each of the second terminals 56 has a second fixed portion (not shown). In the present embodiment, when the second connector 50 is attached to the cable 86, each of the second fixed portions is fixed and connected to a conductive wire (not shown) of the cable 86 via soldering, etc.

Figure 17:
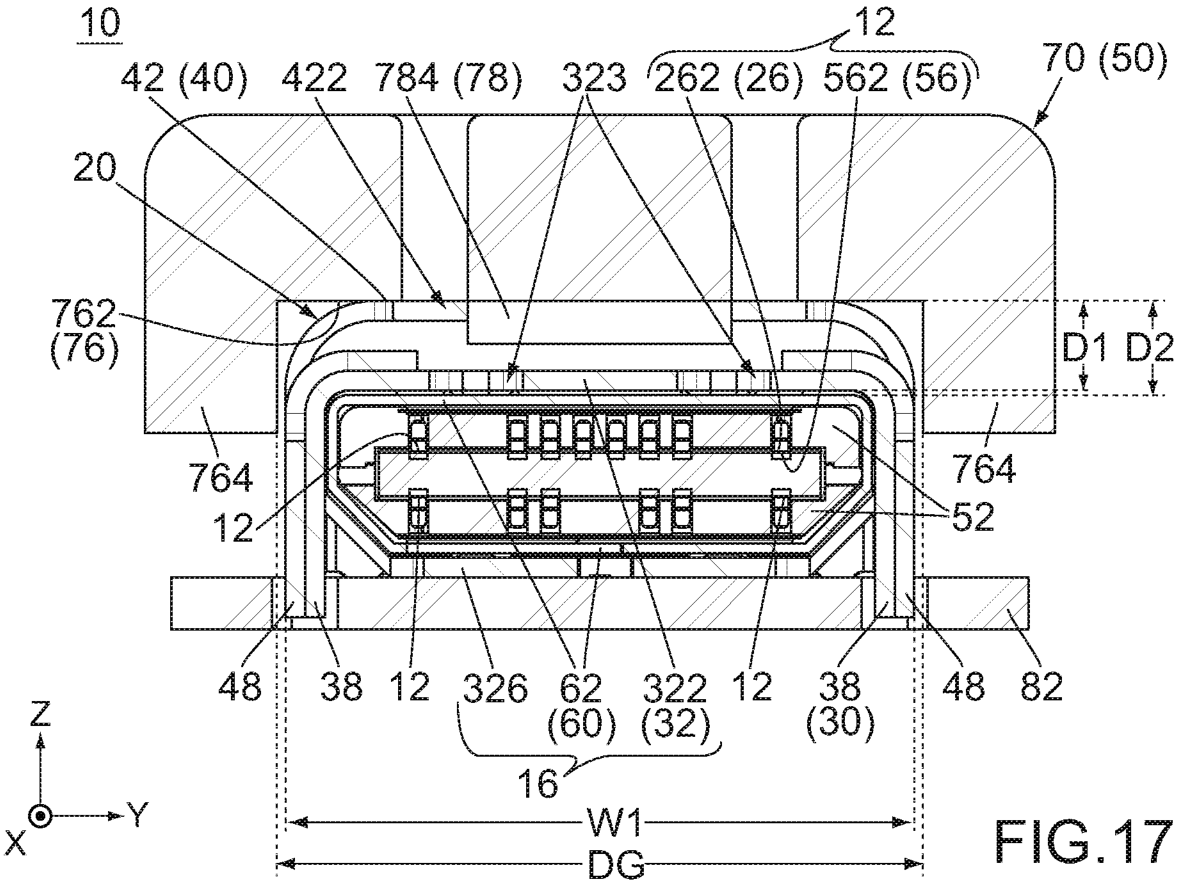
FIG. 17 is a cross-sectional view showing the connector assembly of FIG. 16, taken along line C-C.

Referring to FIG. 17, the second terminals 56 are provided so as to correspond to the first terminals 26 of the first connector 20, respectively. Referring to FIGS. 2, 16 and 17, each of the second terminals 56 has a second contact portion 562. Referring to FIGS. 16 and 17, under the connected state, the second contact portions 562 are in contact with the first contact portions 262, respectively, so that the second connector 50 is electrically connected with the first connector 20. The structure and the number of the second terminals 56 are not specifically limited, provided that the first contact portions 262 are arranged to be brought into contact with the second contact portions 562, respectively, as described above.

Referring to FIGS. 1 and 3, the second shell 60 has a second mating portion 62. Referring to FIG. 17, the second shell 60 is attached to the second holding member 52. The second mating portion 62 encloses the second holding member 52 in the YZ-plane. The second mating portion 62 of the present embodiment is formed of a single metal piece with no hole. The metal piece is bent about an axis in parallel to the X-direction and is then crimped to form the second mating portion 62. Thus, the second mating portion 62 of the present embodiment encloses the second holding member 52 with no gap in the YZ-plane and thereby entirely covers the second contact portions 562 arranged on the second holding member 52. However, the present invention is not limited thereto, but the second mating portion 62 may partially cover the second contact portions 562 in the YZ-plane. Thus, the second mating portion 62 should cover, at least in part, the second contact portions 562 in the YZ-plane.

Figure 11:
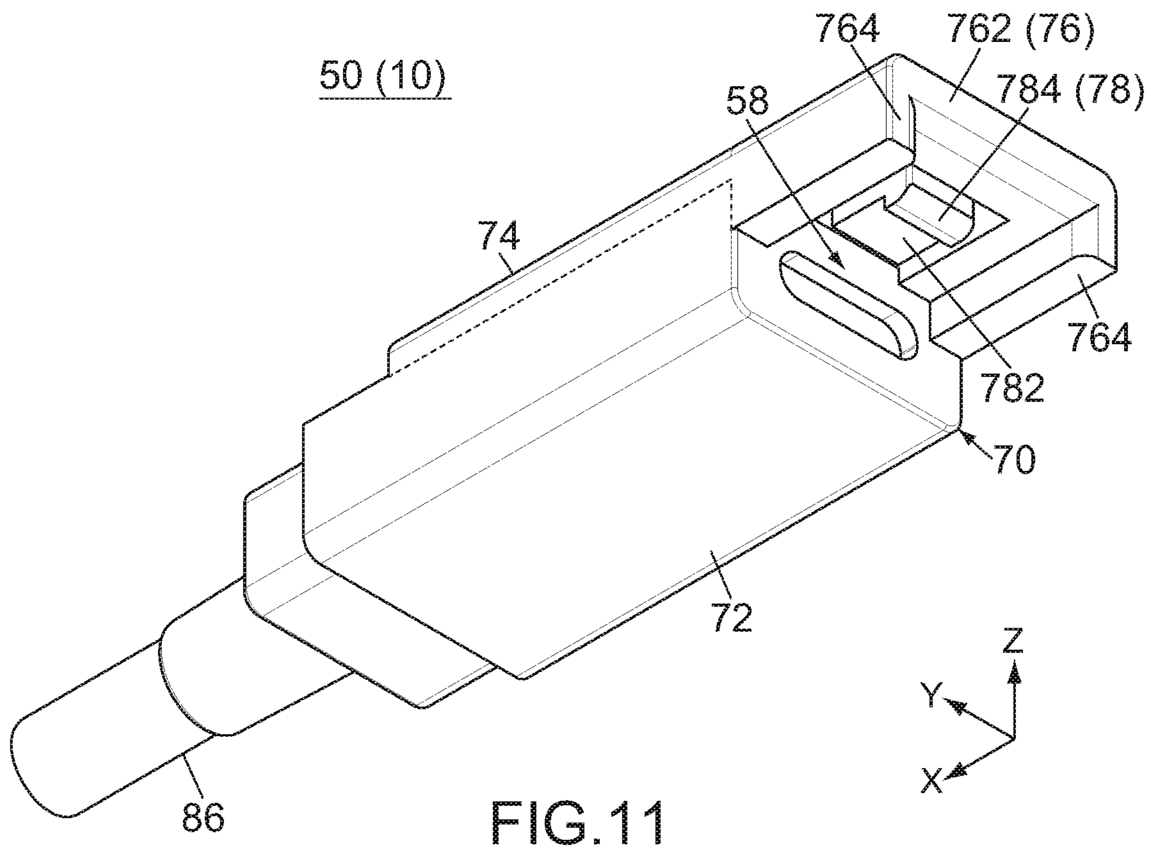
FIG. 11 is a perspective view showing the second connector of the connector assembly of FIG. 1, wherein a second shell of the second connector is not illustrated, and an imaginary boundary line between a base portion and a protection portion of the second engagement member is illustrated with dashed line.

Referring to FIGS. 1 and 2, the second engagement member 70 of the present embodiment has a base portion 72, a protection portion 74 and an engagement arm 78. The second engagement member 70 is located outward of the second holding member 52 and the second shell 60 in the YZ-plane. The base portion 72 entirely cover the second shell 60 except the second mating portion 62 in the YZ-plane. Referring to FIG. 11, an imaginary boundary line between the base portion 72 and the protection portion 74 is illustrated with dashed line. As can be seen from the imaginary boundary line, the protection portion 74 has two parts, one of which projects from the base portion 72 in the Z-direction, and a remaining one of which projects from the base portion 72 in the X-direction. Referring to FIGS. 1 and 2, the protection portion 74 encloses most of the engagement arm 78 in the XY-plane with a distance therebetween. The engagement arm 78 is apart from the base portion 72 in the Z-direction but is connected to the protection portion 74. The second engagement member 70 of the present embodiment has the aforementioned structure. However, the present invention is not limited thereto, but the structure of the second engagement member 70 can be variously modified.

Referring to FIGS. 1 and 3, the second engagement member 70 of the present embodiment partially encloses the second mating portion 62 in the YZ-plane. In detail, the second mating portion 62 projects from the base portion 72 along the X-direction. The protection portion 74 and the engagement arm 78 partially project from the base portion 72 along the X-direction and cover the second mating portion 62 in the Z-direction. Thus, the second engagement member 70 covers one of opposite sides of the second mating portion 62 in the Z-direction, or covers an upper side (positive Z-side) of the second mating portion 62. The second engagement member 70 has no part which covers a remaining one of the opposite sides of the second mating portion 62 in the Z-direction, or covers a lower side (negative Z-side) of the second mating portion 62. The thus-formed second engagement member 70 has a receiving portion 58 which is a space located opposite to the protection portion 74 and the engagement arm 78 in the Z-direction. The second mating portion 62 is located within the receiving portion 58.

As described above, the second engagement member 70 of the present embodiment covers only one of the opposite sides of the second mating portion 62 in the Z-direction. In other words, the second engagement member 70 of the present embodiment is arranged to partially cover the second mating portion 62 in the YZ-plane. However, the present invention is not limited thereto. For example, the second engagement member 70 may entirely cover the second mating portion 62 in the YZ-plane. Thus, the second engagement member 70 should cover, at least in part, the second mating portion 62 in the YZ-plane.

As shown in FIGS. 1 to 3 and 11, the engagement arm 78 of the present embodiment has an engagement support portion 782, an engagement projection 784, two coupling portions 786 and an operation portion 788. The engagement support portion 782 extends along the X-direction. The engagement projection 784 is provided on one of opposite ends of the engagement support portion 782 in the X-direction, or provided on a rear end (negative X-side end) thereof. The engagement projection 784 projects toward the second mating portion 62 in the Z-direction. Referring to FIGS. 1 to 3, the operation portion 788 is provided on a remaining one of the opposite ends of the engagement support portion 782 in the X-direction, or provided on a front end (positive X-side end) thereof. The operation portion 788 is apart from the base portion 72 in the Z-direction and faces the base portion 72 in the Z-direction. The coupling portions 786 are provided on opposite sides of the engagement support portion 782 in the Y-direction, respectively, and are located in the vicinity of the operation portion 788. Each of the coupling portions 786 extends outward from the engagement support portion 782 in the Y-direction and is connected to the protection portion 74.

The engagement support portion 782 of the present embodiment is resiliently deformable so as to be turned about the coupling portions 786. According to general theory, the engagement support portion 782 tends to be easily damaged since it is formed to be resiliently deformable. However, the protection portion 74 of the present embodiment covers the engagement support portion 782 in the XY-plane to prevent the damage of the engagement support portion 782.

The engagement projection 784 is movable in the Z-direction in accordance with resilient deformation of the engagement support portion 782. For example, when the operation portion 788 is pressed toward the base portion 72, the engagement projection 784 is moved to be away from the second mating portion 62 in the Z-direction. One of opposite side surfaces of the engagement projection 784 in the X-direction, or a front surface (positive X-side surface) thereof, is a vertical plane perpendicular to the X-direction. A remaining one of the opposite side surfaces of the engagement projection 784 in the X-direction, or a rear surface (negative X-side surface) thereof, is an arc-like surface which is gently curved.

Summarizing the explanation described above, the second engagement member 70 has the engagement projection 784 and the engagement support portion 782. The engagement projection 784 is supported by the engagement support portion 782 to be movable in the Z-direction. The engagement projection 784 is located outward of the second shell 60 in the Z-direction and projects toward the second shell 60. According to the present embodiment, the engagement projection 784 and the engagement support portion 782 are provided as parts of the engagement arm 78 together with the operation portion 788. However, the structure of the second engagement member 70 is not limited to the present embodiment. For, example, the second engagement member 70 does not need to have the operation portion 788. The engagement support portion 782 does not need to be resiliently deformable, provided that the engagement projection 784 is movable in the Z-direction. For example, the engagement support portion 782 may be rotatable about a coupling portion which is formed of a pin. The protection portion 74 may be provided as necessary.

Referring to FIGS. 1 and 11, the second engagement member 70 of the present embodiment has a guide portion 76. The guide portion 76 has a main guide portion 762 and two side guide portions 764. The main guide portion 762 extends along the Y-direction in the YZ-plane. The side guide portions 764 extend from opposite ends of the main guide portion 762 in the Y-direction, respectively, and extend toward the second mating portion 62 along the Z-direction in parallel to each other. According to the present embodiment, each of the main guide portion 762 and the side guide portions 764 is a part of the protection portion 74. In detail, each of the main guide portion 762 and the side guide portions 764 is a projecting part of the protection portion 74 which projects from the base portion 72 in the X-direction. However, the present invention is not limited thereto. For example, each of the main guide portion 762 and the side guide portions 764 may be a part separated from the protection portion 74.

Figure 12:
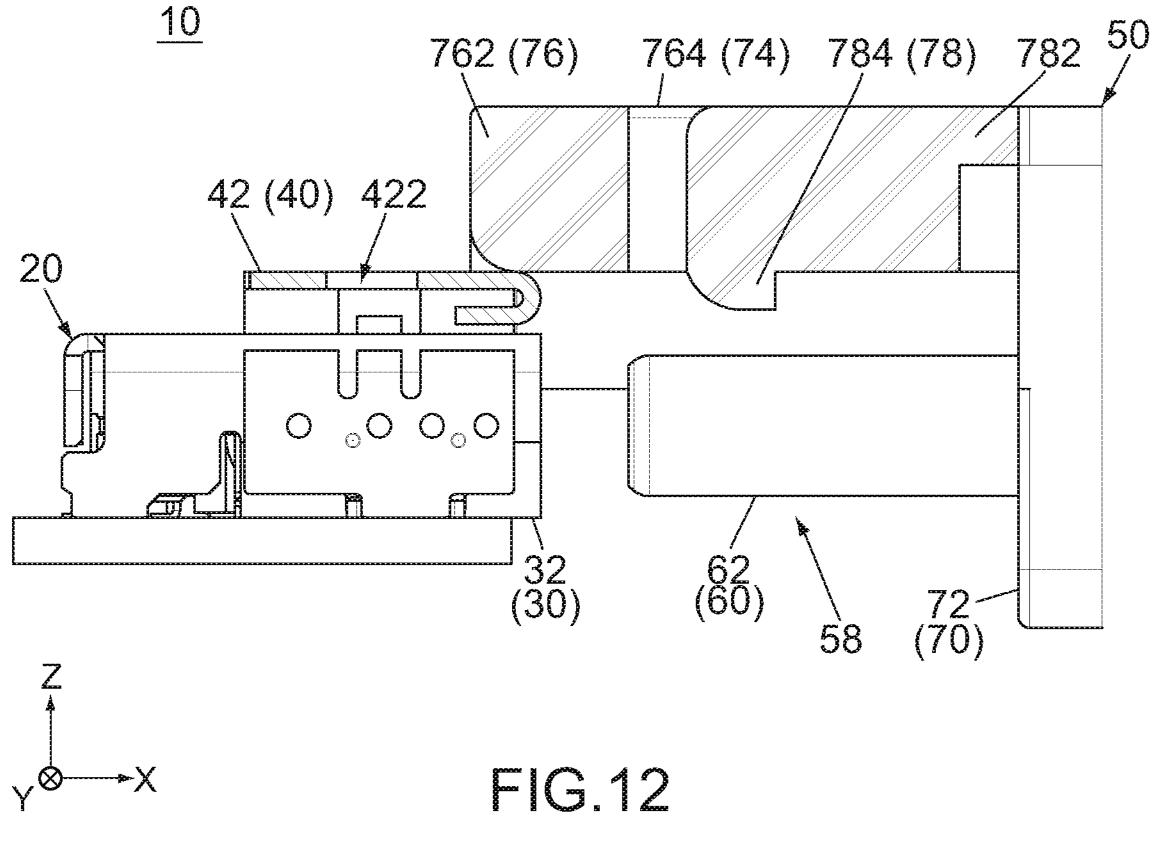
FIG. 12 is a side view showing a part of the connector assembly enclosed by dashed line B of FIG. 3, wherein the first connector and the second connector are partially cut away along line A-A of FIG. 2.
Figure 13:
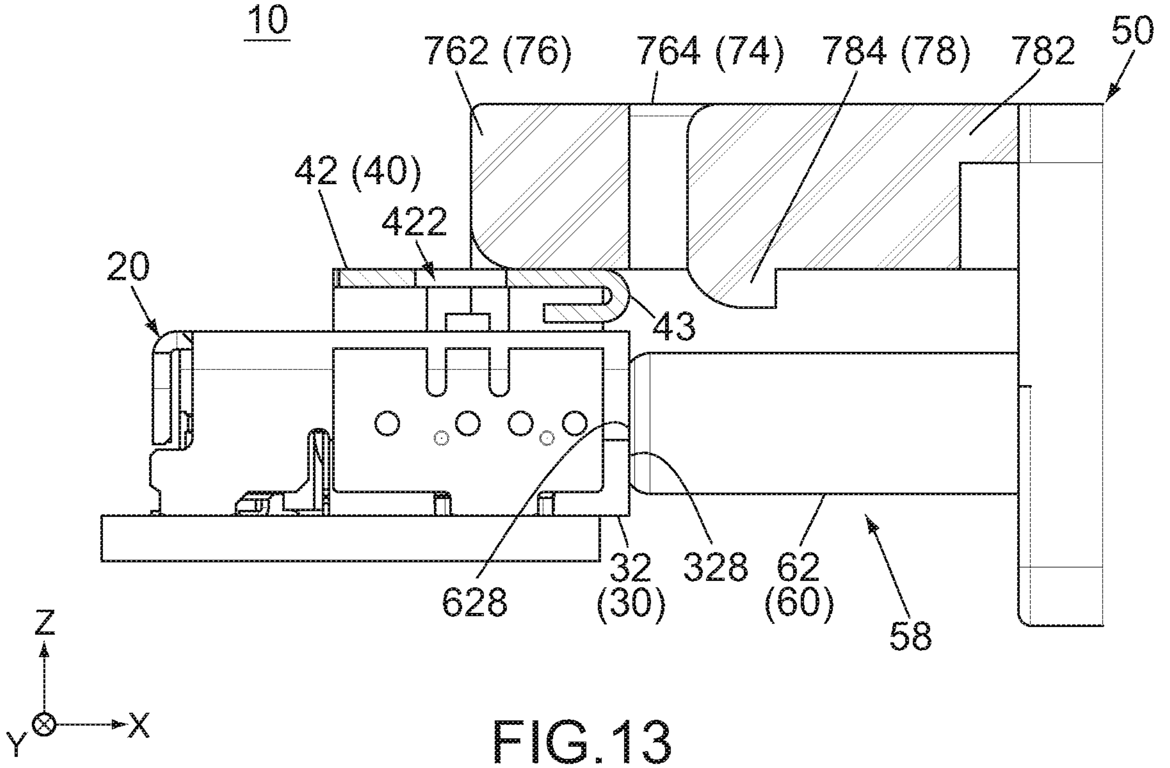
FIG. 13 is a side view showing the connector assembly of FIG. 12, wherein a second mating portion of the second connector is nearer to a first mating portion of the first connector than the second mating portion of FIG. 12 is.
Figure 14:
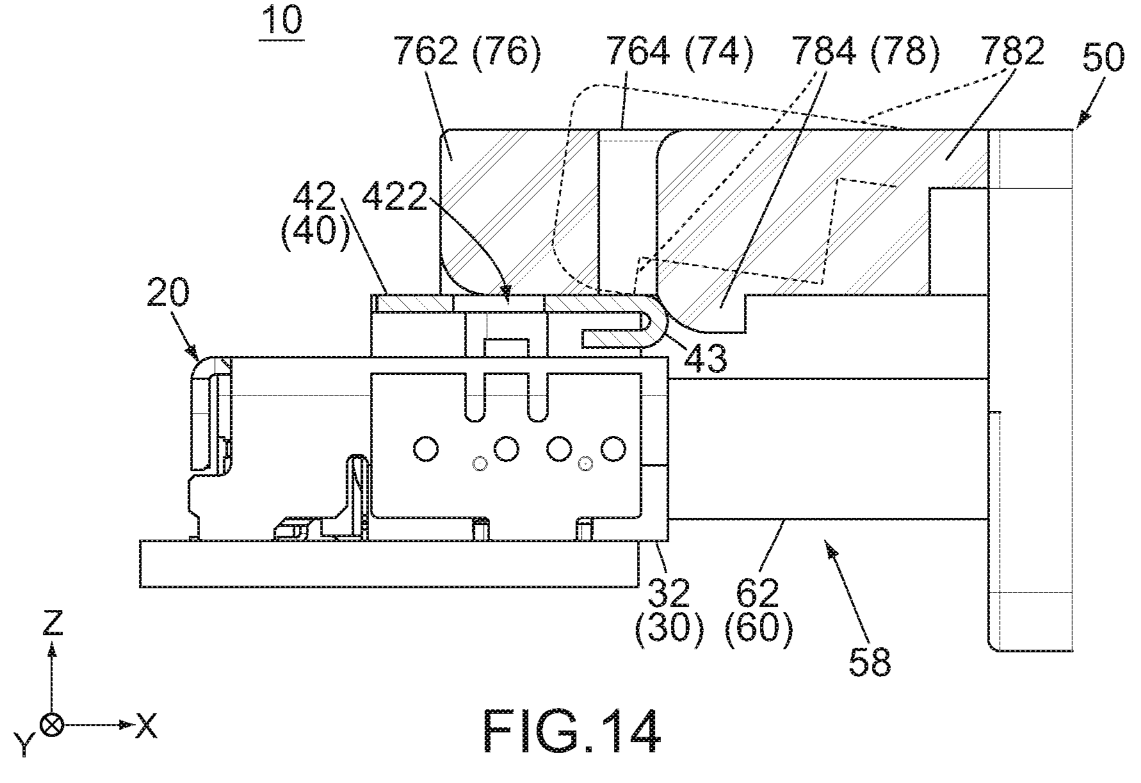
FIG. 14 is a side view showing the connector assembly of FIG. 12, wherein the second mating portion is partially received in the first mating portion, and outlines of an engagement support portion and an engagement projection of the second connector when the engagement support portion is resiliently deformed are partially illustrated with dashed line.

Referring to FIG. 17, in the Z-direction, a distance dimension D2 between the main guide portion 762 and the second mating portion 62 is slightly larger than another distance dimension D1 between an outside surface of the first engagement member 40 in the Z-direction and an inside surface of the main plate 322 in the Z-direction. In addition, in the Y-direction, a distance dimension DG between the two side guide portions 764 is slightly larger than a width dimension W1 of the first connector 20. Referring to FIGS. 12 to 14, the guide portion 76 arranged as described above guides a position of the second mating portion 62 relative to the first mating portion 32 in the YZ-plane while the first connector 20 and the second connector 50 are connected to each other. However, the present invention is not limited thereto, but the guide portion 76 may be provided as necessary. Even in a case where the guide portion 76 is provided, the structure of the guide portion 76 is not limited to the present embodiment.

As shown in FIG. 3, the second mating portion 62 has an end 628 which is a rear end (negative X-side end) thereof. The guide portion 76 has an end 768 which is a rear end (negative X-side end) thereof. The end 628 of the second mating portion 62 is located between the engagement projection 784 and the end 768 of the guide portion 76 in the X-direction. According to this arrangement, in a connection operation in which the first connector 20 and the second connector 50 are connected to each other, the guide portion 76 positions the second mating portion 62 relative to the first mating portion 32 before the second mating portion 62 is close to the first mating portion 32. However, the present invention is not limited thereto, but the arrangement of the guide portion 76 can be modified as necessary.

Hereafter, explanation will be made about the connection operation, in which the second connector 50 is connected to the first connector 20, and a removal operation in which the second connector 50 connected to the first connector 20 is removed from the first connector 20. In the explanation described below about the connection operation and the removal operation, the negative X-direction and the positive X-direction of the connection direction (X-direction) are referred to as a mating direction and a removing direction, respectively.

Referring to FIG. 12, the connector assembly 10 is under the separated state, and the second mating portion 62 of the second connector 50 faces the first mating portion 32 of the first connector 20 in the X-direction. Referring to FIGS. 12 and 13, as the second connector 50 is moved toward the first connector 20 along the mating direction (negative X-direction), the second mating portion 62 approaches the first mating portion 32 and is positioned relative to the first mating portion 32. Referring to FIG. 13, when the end 628 of the second mating portion 62 is moved to the end 328 of the first mating portion 32, or the front end (positive X-side end) thereof, the engagement projection 784 is apart from the folded portion 43 of the first engagement member 40.

Referring to FIG. 14, when the second connector 50 is further moved along the negative X-direction, the second mating portion 62 is partially received in the first mating portion 32, and the arc-like surface of the engagement projection 784 is brought into abutment with the arcuate portion of the folded portion 43. When the second connector 50 is further moved along the negative X-direction, the engagement support portion 782 is resiliently deformed, and the engagement projection 784 is moved in the Z-direction to be located on the flat-plate portion 42 of the first engagement member 40 (see dashed line in FIG. 14). Meanwhile, the arcuate portion of the folded portion 43 guides the arc-like surface of the engagement projection 784 so that the engagement projection 784 is smoothly moved onto the flat-plate portion 42. When the second connector 50 is further moved along the negative X-direction, the engagement projection 784 slides on the flat-plate portion 42.

Figure 15:
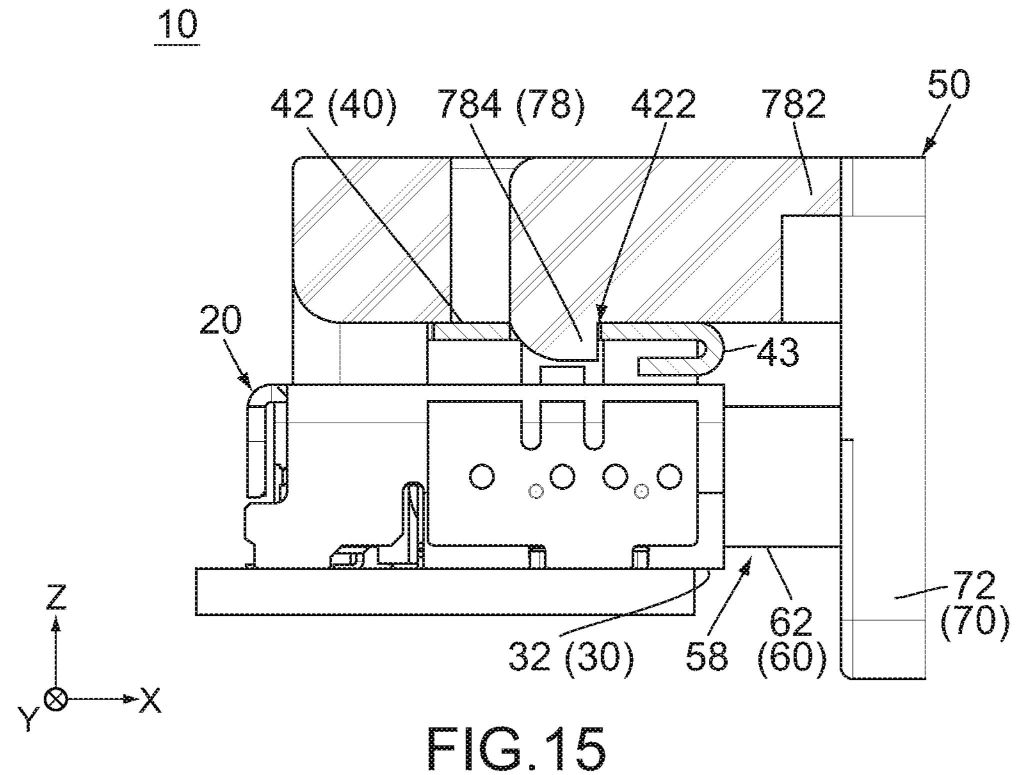
FIG. 15 is a side view showing the connector assembly of FIG. 12, wherein the first connector and the second connector are under the connected state where they are connected to each other.

Referring to FIG. 15, when the second connector 50 is further moved along the negative X-direction, the second mating portion 62 is fit into the first mating portion 32. At that time, the connector assembly 10 is under the connected state. Under the connected state according to the present embodiment, the base portion 72 of the second engagement member 70 is apart from the first mating portion 32 in the X-direction, and a part of the second mating portion 62 which is near to the base portion 72 is located outside the first mating portion 32. However, the present invention is not limited thereto, but the positional relation between the first mating portion 32 and the second mating portion 62 under the connected state can be modified as necessary.

Under the connected state, the engagement projection 784 is moved to the engagement recess 422 of the flat-plate portion 42. At that time, the engagement support portion 782 returns to its initial shape, and the engagement projection 784 is received in the engagement recess 422. As a result, the connected state is locked. Thus, under the connected state, the engagement projection 784 and the engagement recess 422 are engaged with each other to lock the connected state. More specifically, even if the second connector 50 under the connected state is pulled along the removing direction (positive X-direction), the connected state is kept. Thus, the connector assembly 10 of the present embodiment has a lock mechanism which is formed of the engagement projection 784 and the engagement recess 422.

The engagement projection 784 of the present embodiment projects from the engagement support portion 782 in the Z-direction by a distance dimension (projecting distance dimension) larger than a thickness dimension of the flat-plate portion 42. Moreover, a distance dimension between the flat-plate portion 42 and the main plate 322 in the Z-direction is larger than the projecting distance dimension of the engagement projection 784. This structure enables the engagement projection 784 received in the engagement recess 422 to be deeply inserted into the first connector 20 in the Z-direction. Moreover, the vertical plane of the engagement projection 784 faces an inner edge of the engagement recess 422 in the X-direction to lock the connected state. Moreover, the flat-plate portion 42 having high strength is reinforced by the folded portion 43 and is hardly bent even if a force is applied thereto. The aforementioned lock mechanism more securely locks the connected state. However, the lock mechanism according to the present invention is not limited to the present embodiment but can be variously modified.

Referring to FIGS. 16 and 17, under the connected state, the first contact portions 262 of the first terminals 26 are in contact with the second contact portions 562 of the second terminals 56 at contact areas 12, respectively. Under the connected state, the first mating portion 32 and the second mating portion 62 are fit with each other to form a mating portion 16. The second mating portion 62 of the present embodiment has no gap in the YZ-plane. Therefore, although the first mating portion 32 has the holes 323, the mating portion 16 entirely enclose the contact areas 12, at each of which the first contact portion 262 and the second contact portion 562 are in contact with each other, in the YZ-plane. This structure prevents the connector assembly 10 from being formed of a hole which might cause electromagnetic interference (EMI).

As described above, the present embodiment provides the connector assembly 10 which has the lock mechanism and is provided with the structure for preventing EMI. The connector assembly 10 can be uses for high-speed signal transmission. The present embodiment enables both the lock mechanism and prevention of EMI by dividing the members into members which forms the lock mechanism and the other members which forms the structure for preventing EMI.

As previously described, according to the present embodiment, the first mating portion 32 is formed with the holes 323, while the second mating portion 62 is formed with no hole. However, the present invention is not limited thereto. The second mating portion 62 may be formed with some holes, provided that the mating portion 16 formed under the connected state has no hole. In other words, each of the first mating portion 32 and the second mating portion 62 may be formed with one or more holes each of which does not overlap with the other hole under the connected state.

Referring to FIGS. 3 and 15, when the operation portion 788 of the engagement arm 78 is pressed toward the base portion 72 under the connected state of the first connector 20 and the second connector 50, the engagement projection 784 is moved along the Z-direction to come out of the engagement recess 422. Thus, the locked state is released. When the second connector 50, which is released from the locked state, is moved along the removing direction (positive X-direction), the second connector 50 can be removed from the first connector 20.

Figure 18:
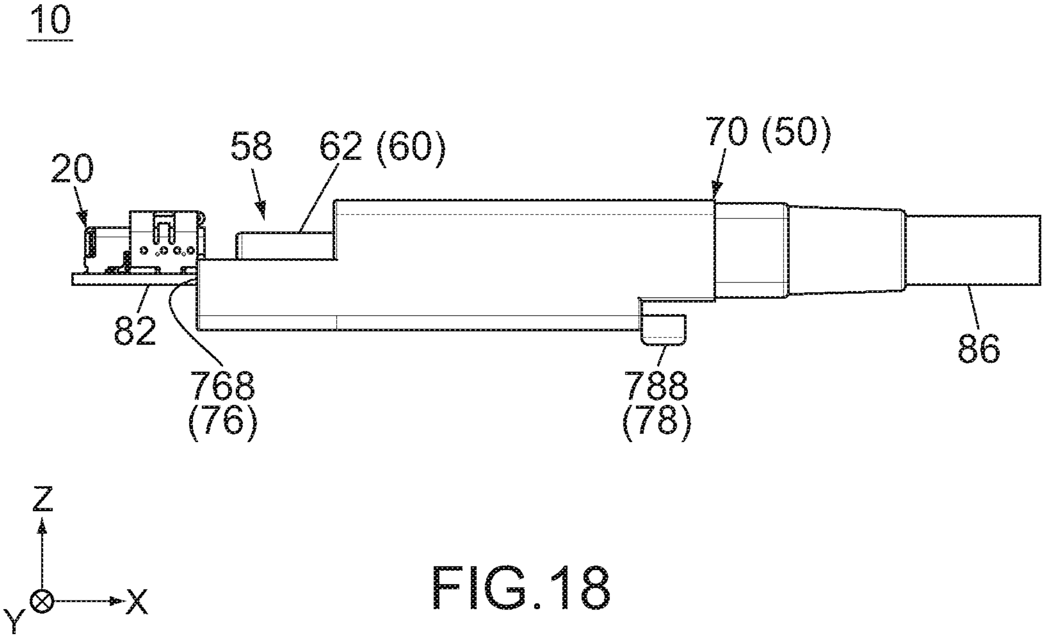
FIG. 18 is a side view showing the connector assembly of FIG. 1, wherein the second connector is upside down relative in comparison with the second connector of FIG. 1.

Referring to FIGS. 12 and 15, according to the present embodiment, the receiving portion 58 of the second connector 50 partially receives the first connector 20 under the connected state. The thus-arranged receiving portion 58 allows the second connector 50 to be connected to the first connector 20 although the guide portion 76 projects toward the first connector 20. Moreover, the guide portion 76 prevents reverse insertion of the second mating portion 62 into the first mating portion 32. More specifically, referring to FIG. 18, if the second mating portion 62 is forced to be inserted upside down into the first mating portion 32, the end 768 of the guide portion 76 is brought into abutment with and is stopped by the board 82. Therefore, the second connector 50 cannot be connected to the first connector 20 even if the second mating portion 62 has a shape which is insertable upside down into the first mating portion 32. Moreover, because the end 768 is brought into abutment with the board 82 before the contact of the second connector 50 with the first connector 20, production of metal powder, which might be produced due to misaligned mating, can be prevented.

The present invention can be further variously applicable in addition to the first embodiment and the various modifications which are already described. Hereafter, explanation will be made about a second embodiment of the present invention.

Second Embodiment

Figure 19:
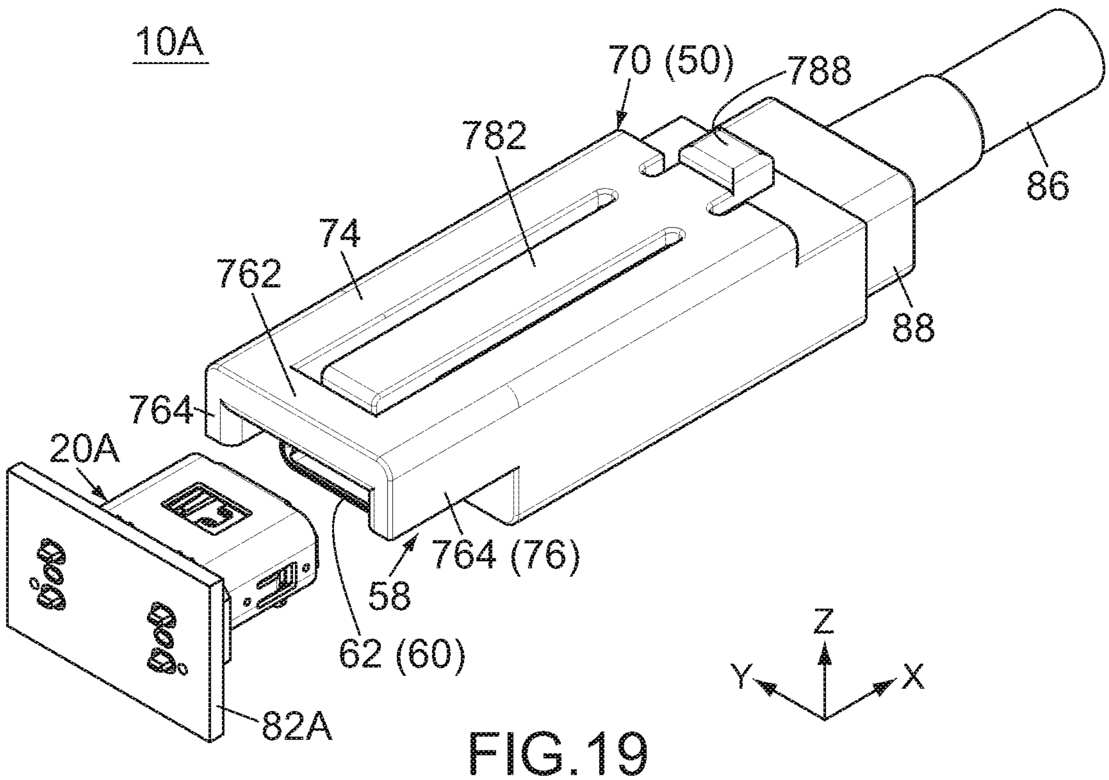
FIG. 19 is a perspective view showing a connector assembly according to a second embodiment of the present invention, wherein a first connector and the second connector of the connector assembly are under a separated state where they are separated from each other, the first connector is mounted on a board, and the second connector is connected to the cable.

As shown in FIG. 19, a connector assembly 10A according to the second embodiment of the present invention comprises a first connector 20A different from the first connector 20 (see FIG. 1) and the second connector 50 same as that of the connector assembly 10 (see FIG. 1). However, the present invention is not limited thereto, but the connector assembly 10A may comprise a second connector different from the second connector 50.

Figure 25:
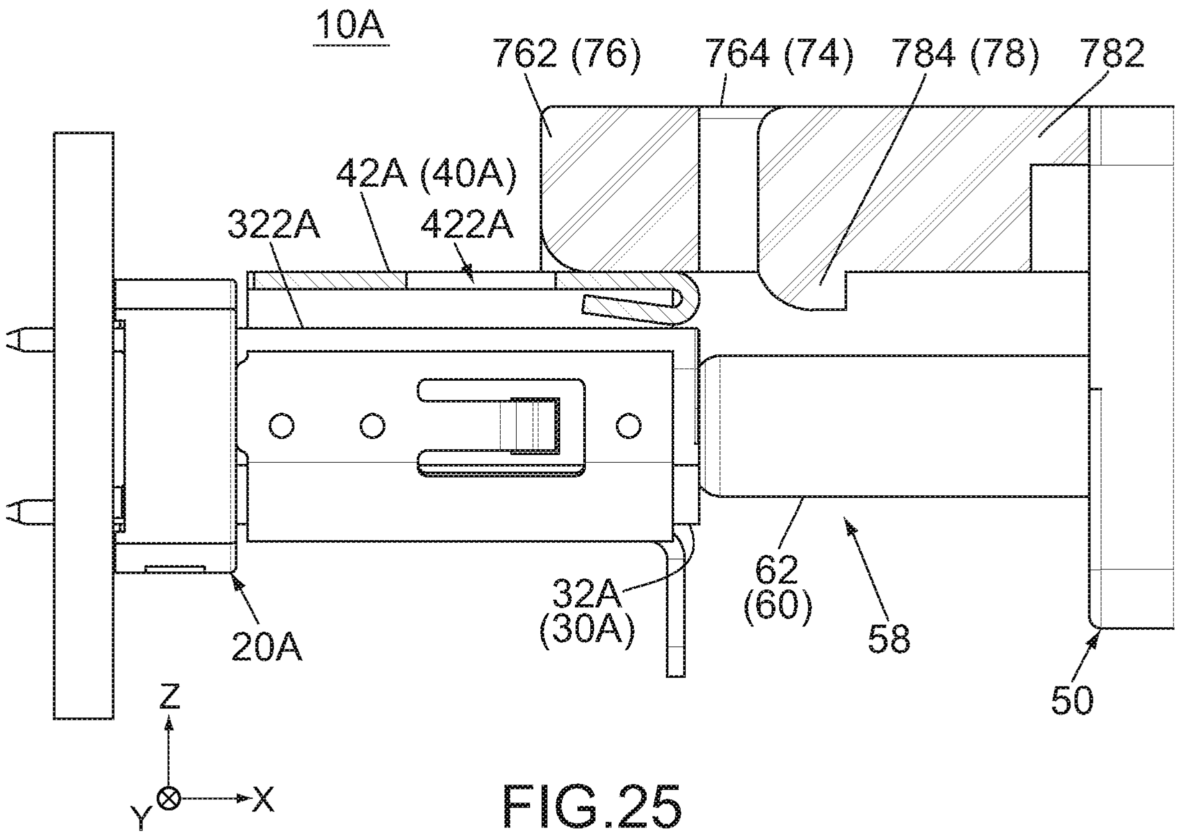
FIG. 25 is a side view showing a part of the connector assembly of FIG. 19, wherein the first connector and the second connector are during an operation in which they are connected to each other, and the first connector and the second connector are partially cut away similarly to those of FIG. 13.
Figure 27:
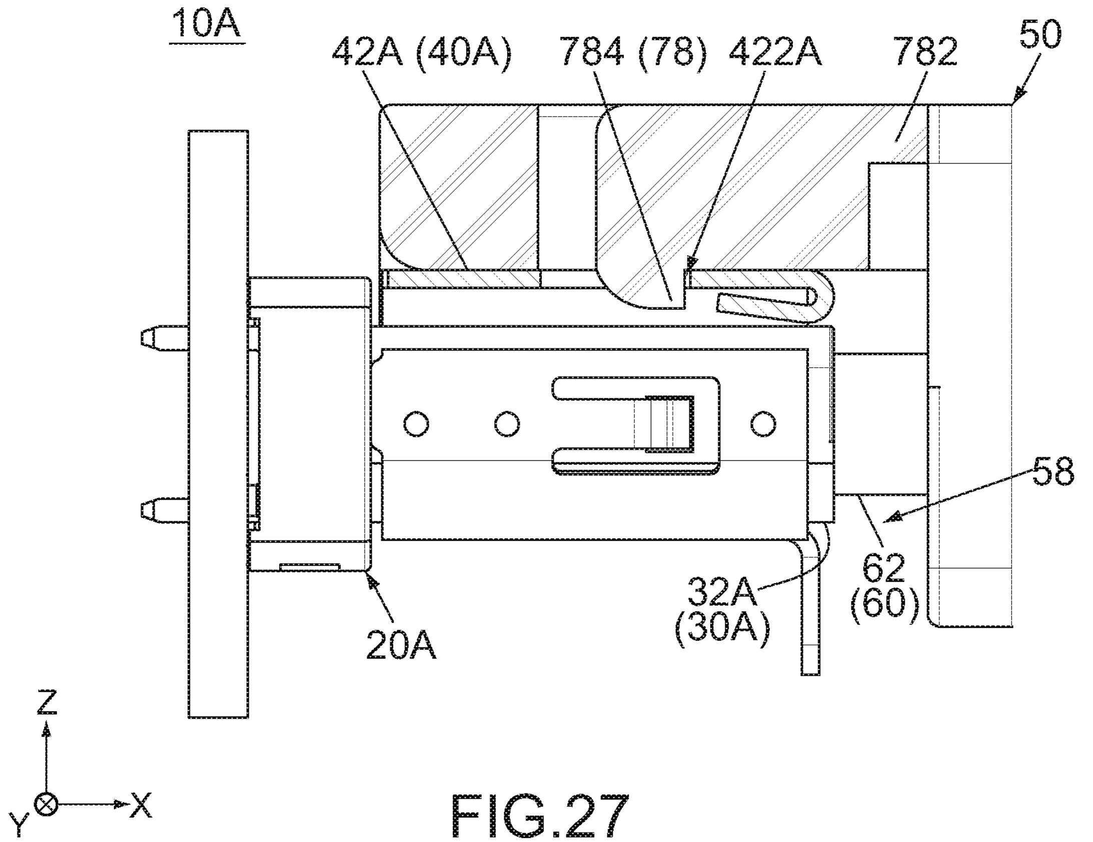
FIG. 27 is a side view showing the connector assembly of FIG. 25, wherein the first connector and the second connector are under the connected state.

Referring to FIGS. 25 and 27, the first connector 20A and the second connector 50 are connectable to each other along a connection direction (front-rear direction: X-direction) similarly to the connector assembly 10. The first connector 20A of the present embodiment is an on-board receptacle connector similar to the first connector 20 (see FIG. 1). However, the first connector 20A is a so-called straight-type receptacle. Hereafter, explanation will be made about the structure of the first connector 20A. The explanation will be made mainly about difference from the first connector 20.

Figure 20:
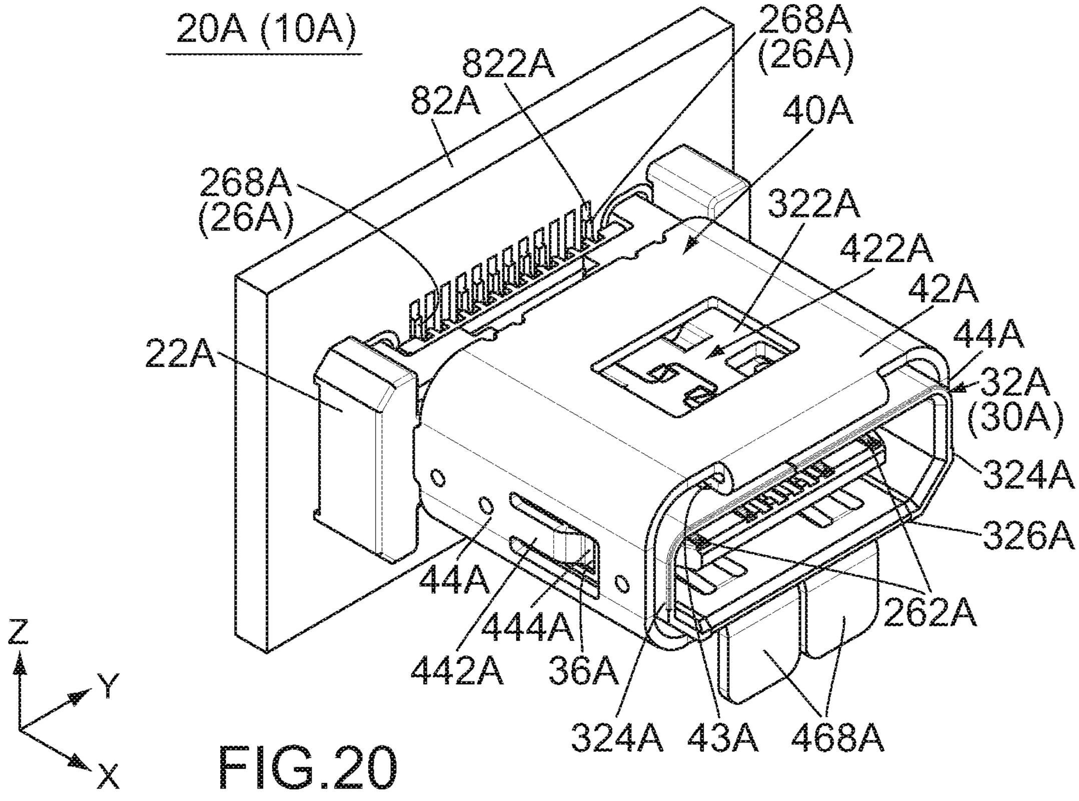
FIG. 20 is a perspective view showing the first connector of the connector assembly of FIG. 19.
Figure 21:
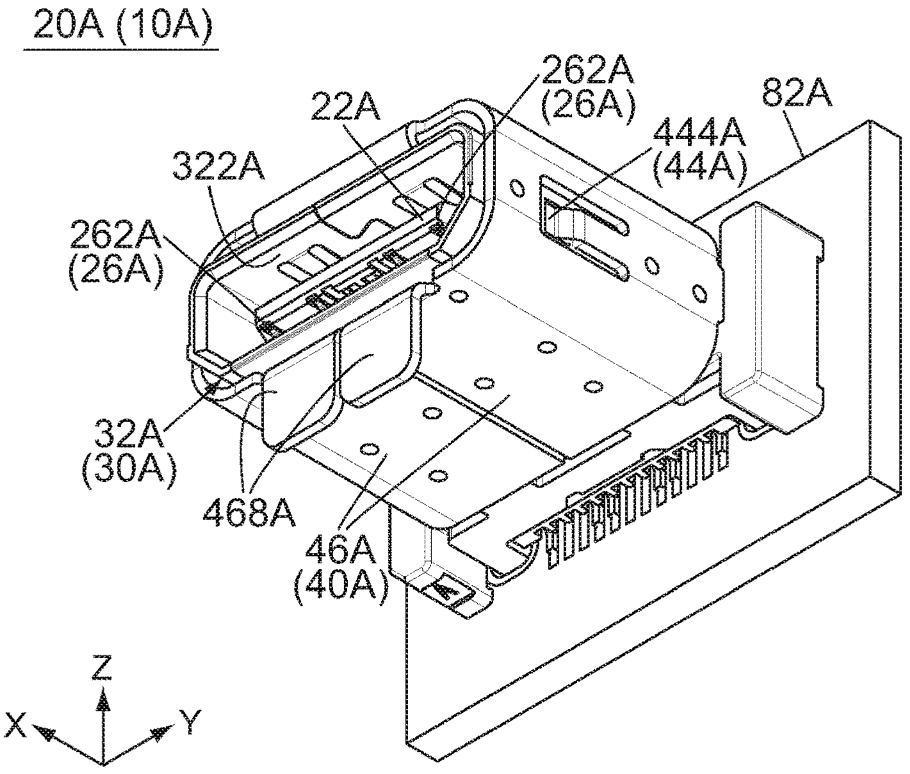
FIG. 21 is another perspective view showing the first connector of FIG. 20.

Referring to FIGS. 20 and 21, the first connector 20A of the present embodiment comprises a first holding member 22A made of insulator, a plurality of first terminals 26A each made of conductor, a first shell 30A made of conductor and a first engagement member 40A made of material having high strength. According to the present embodiment, the first engagement member 40A is a member other than the first shell 30A. Each of the first terminals 26A, the first shell 30A and the first engagement member 40A is made of metal. However, the present invention is not limited thereto. For example, the first engagement member 40A may be formed integrally with the first shell 30A. Instead, the first connector 20A may further comprise the other member in addition to the aforementioned members.

Figure 22:
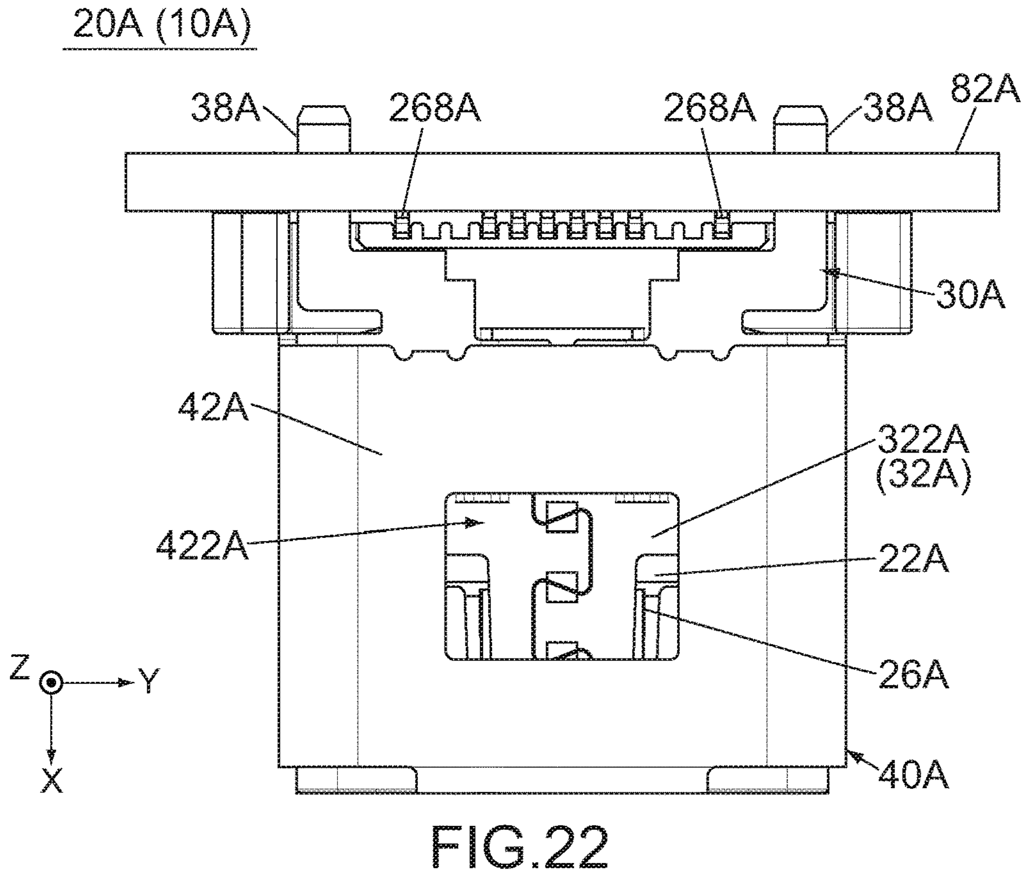
FIG. 22 is a top view showing the first connector of FIG. 20.
Figure 23:
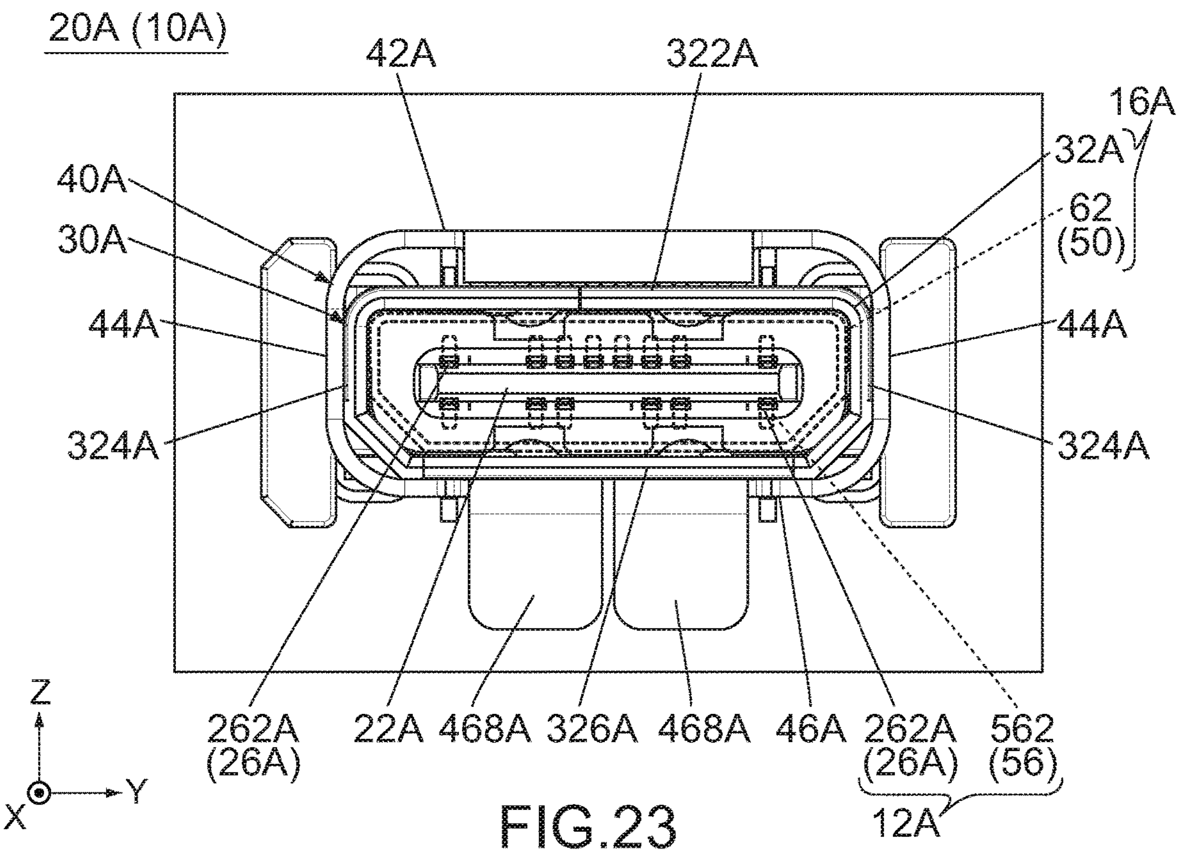
FIG. 23 is a front view showing the first connector of FIG. 20, wherein an outline of the second connector under a connected state where the first connector and the second connector are connected to each other is partially illustrated with dashed line.

Referring to FIG. 22, the first terminals 26A are held by the first holding member 22A. Referring to FIG. 20, each of the first terminals 26A has a first contact portion 262A and a first fixed portion 268A. In the present embodiment, when the first connector 20A is mounted on a board 82A, each of the first fixed portions 268A is fixed on and connected to a conductive pad 822A of the board 82A via soldering, etc. Referring to FIGS. 20, 21 and 23, the first terminals 26A are provided so as to correspond to the second terminals 56 (see FIG. 17) of the second connector 50 (see FIG. 17). Under a connected state (see FIG. 27), the first contact portions 262A are in contact with the second contact portions 562 (see FIG. 17) of the second terminals 56, respectively, so that the first connector 20A is electrically connected with the second connector 50.

Referring to FIGS. 20 and 23, the first shell 30A of the present embodiment is attached to the first holding member 22A. The first shell 30A has a first mating portion 32A. The first mating portion 32A has a main plate 322A, two side plates 324A and an opposite plate 326A. The main plate 322A and the opposite plate 326A are located at opposite sides of the first mating portion 32A, respectively, in a perpendicular direction (upper-lower direction: Z-direction) perpendicular to the X-direction. Each of the main plate 322A and the opposite plate 326A extends along a predetermined plane (XY-plane) perpendicular to the Z-direction. The side plates 324A are located at opposite sides of the first mating portion 32A, respectively, in a predetermined direction (lateral direction: Y-direction) perpendicular to both the X-direction and the Z-direction. Each of the side plates 324A couples the main plate 322A and the opposite plate 326A to each other in the Z-direction.

The first mating portion 32A of the present embodiment encloses the first holding member 22A in a perpendicular plane (YZ-plane) perpendicular to the X-direction. In particular, the first mating portion 32A covers, at least in part, the first contact portions 262A which are arranged on the first holding member 22A, in the YZ-plane.

Figure 24:
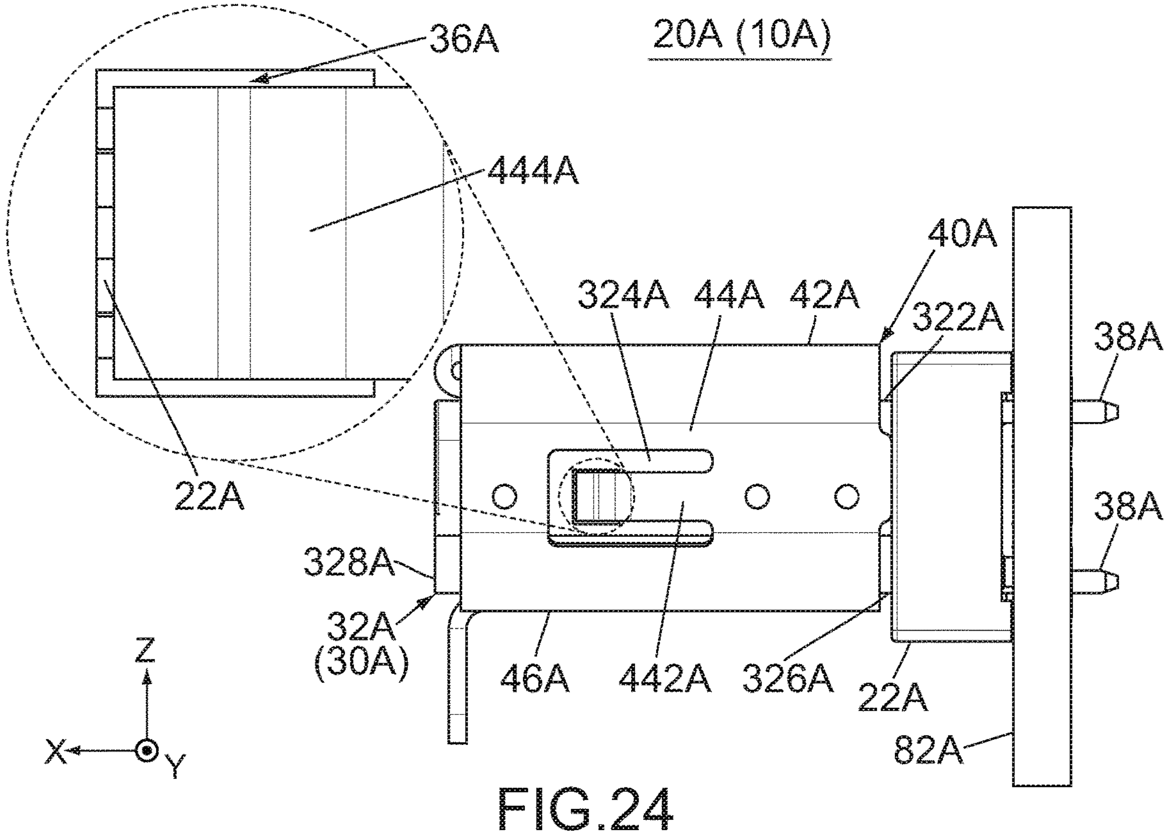
FIG. 24 is a side view showing the first connector of FIG. 20, wherein a part of the first connector enclosed by dashed line is enlarged and illustrated.

As shown in FIGS. 22 and 24, the first shell 30A of the present embodiment has a plurality of fixed portions 38A. Each of the main plate 322A and the opposite plate 326A of the present embodiment is provided with two of the fixed portions 38A. Each of the fixed portions 38A extends along the X-direction as a whole. When the first connector 20A is mounted on the board 82A, each of the fixed portions 38A is press-fit into and fixed to the board 82A and is connected to a ground pattern (not shown). The board 82A are arranged to extend along the YZ-plane. Thus, when the first connector 20A is used, the first connector 20A is fixed on the board 82A which extends along the YZ-plane, and the first mating portion 32A extends along the X-direction perpendicular to the board 82A.

Referring to FIGS. 20, 21 and 23, the first engagement member 40A of the present embodiment is attached to the first shell 30A. The first engagement member 40A has a flat-plate portion 42A, two side-plate portions 44A and an opposite portion 46A. The flat-plate portion 42A and the opposite portion 46A are located at opposite sides of the first engagement member 40A in the Z-direction, respectively. Each of the flat-plate portion 42A and the opposite portion 46A intersects with the Z-direction. The opposite portion 46A includes two parts arranged in the Y-direction. The side-plate portions 44A are located at opposite sides of the first engagement member 40A in the Y-direction, respectively. Each of the side-plate portions 44A couples the flat-plate portion 42A and the opposite portion 46A to each other in the Z-direction. The first engagement member 40A of the present embodiment has the aforementioned structure. However, the present invention is not limited thereto, but the structure of the first engagement member 40A can be variously modified.

The first engagement member 40A of the present embodiment encloses most of the first shell 30A in the YZ-plane. Referring to FIG. 23, the flat-plate portion 42A covers the main plate 322A of the first shell 30A in the Z-direction with a distance therebetween. The two side-plate portions 44A cover the two side plates 324A of the first shell 30A in the Y-direction, respectively. The opposite portion 46A covers the opposite plate 326A of the first shell 30A in the Z-direction. The first engagement member 40A of the present embodiment is arranged to cover the first shell 30A as described above. However, the present invention is not limited thereto, but the arrangement of the first engagement member 40A can be variously modified.

Referring to FIGS. 20 and 22, the first engagement member 40A is formed with an engagement recess 422A. The engagement recess 422A of the present embodiment is formed in the flat-plate portion 42A. The engagement recess 422A is located outward of the first shell 30A in the Z-direction. In detail, the flat-plate portion 42A is apart from the first mating portion 32A, which includes the main plate 322A, of the first shell 30A in the Z-direction, so that the engagement recess 422A is apart from the main plate 322A in the Z-direction. As shown in FIG. 20, the first engagement member 40A of the present embodiment has a folded portion 43A similar to the folded portion 43 (see FIG. 5). The flat-plate portion 42A is reinforced by the folded portion 43A to be hardly bent. Therefore, the engagement recess 422A is hardly moved in the Z-direction.

As shown in FIGS. 20 and 24, the first shell 30A of the present embodiment has two inner positioning portions (openings) 36A. The first engagement member 40A of the present embodiment has two outer positioning portions 444A which correspond to the inner positioning portions 36A, respectively. The inner positioning portions 36A are holes which are formed through the side plates 324A of the first mating portion 32A, respectively. Thus, each of the inner positioning portions 36A is an opening formed in the first mating portion 32A and opens inward and outward from the first mating portion 32A in the YZ-plane. Each of the side-plate portions 44A is formed with a spring piece 442A. Each of the outer positioning portions 444A is an end of the spring piece 442A. Each of the spring pieces 442A extends along the X-direction as a whole and is resiliently deformable. Each of the outer positioning portions 444A is supported by the spring piece 442A and projects inward in the YZ-plane.

According to the present embodiment, the outer positioning portions 444A are received in the inner positioning portions 36A, respectively, and close, at least in part, the inner positioning portions 36A, respectively. One of opposite ends of each of the side-plate portions 44A in the X-direction, or a rear end (negative X-side end) thereof, is in contact with or faces a part of the first holding member 22A with a slight distance therebetween in the X-direction. In addition, one of opposite ends of each of the outer positioning portions 444A in the X-direction, or a front end (positive X-side end) thereof, is in contact with or faces an inner edge of the inner positioning portion 36A with a slight distance therebetween in the X-direction. The thus-arranged first engagement member 40A hardly comes off the first shell 30A even when the first engagement member 40A receives a force along the X-direction. Thus, each of the inner positioning portions 36A and the corresponding outer positioning portion 444A are combined to each other, so that the first engagement member 40A is positioned and fixed to the first shell 30A.

Referring to FIGS. 20, 21 and 23, the first connector 20A has two stoppers 468A. The stoppers 468A of the present embodiment are connected to the two parts of the opposite portion 46A of the first engagement member 40A, respectively, and are arranged in the Y-direction. Referring to FIG. 24, each of the stoppers 468A is located in the vicinity of an end 328A of the first mating portion 32A, or a front end (positive X-side end) thereof, in the X-direction and extends along the Z-direction to be away from the first mating portion 32A. As described above, the stoppers 468A are provided on only one of the opposite sides of the first connector 20A in the Z-direction. According to the present embodiment, the two stoppers 468A are provided. However, the number of the stoppers 468A according to the present invention is not specifically limited. For example, the number of the stopper 468A may be one.

Hereafter, explanation will be made about a connection operation in which the second connector 50 is connected to the first connector 20A and a removal operation in which the second connector 50 connected to the first connector 20A is removed from the first connector 20A. The explanation will be made mainly about difference from the first embodiment.

Figure 26:
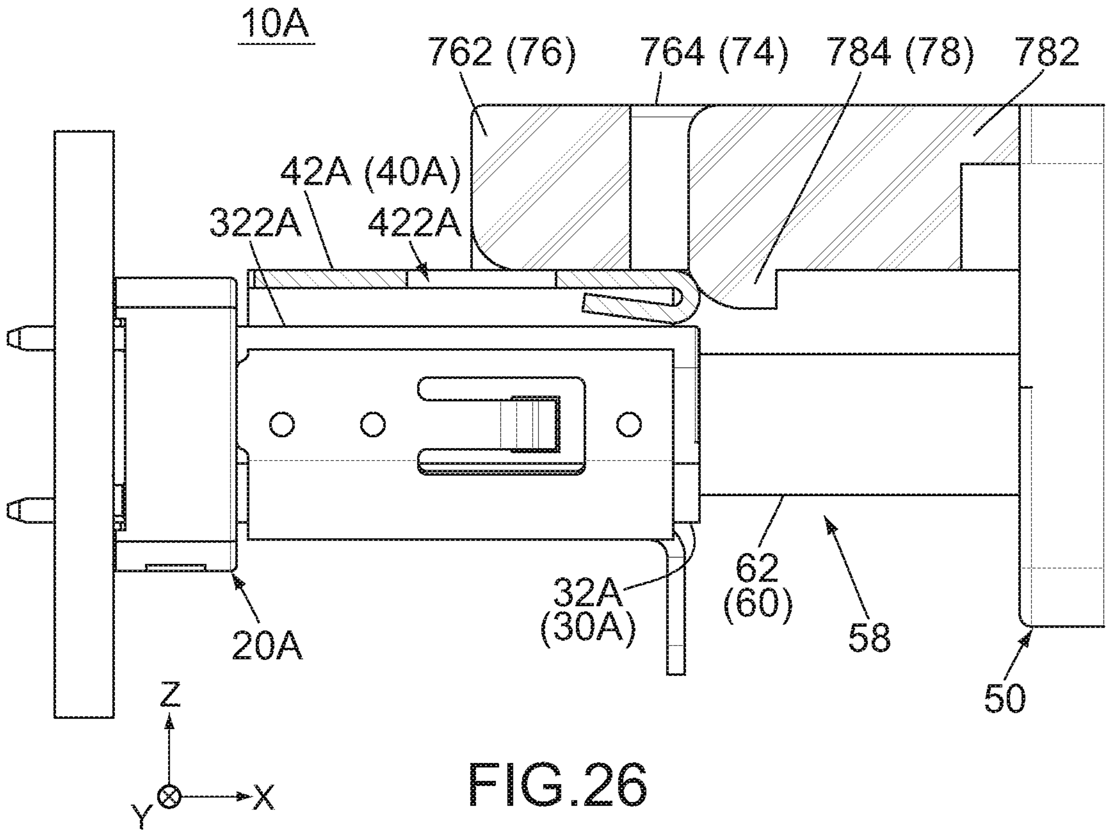
FIG. 26 is a side view showing the connector assembly of FIG. 25, wherein the second mating portion of the second connector is partially received in a first mating portion of the first connector.

Referring to FIGS. 25 to 27, when the second connector 50 under the separated state is moved toward the first connector 20A along a mating direction (negative X-direction), the first connector 20A and the second connector 50 take the connected state where they are connected to each other. While the first connector 20A and the second connector 50 are connected to each other, the guide portion 76 guides a position of the second mating portion 62 relative to the first mating portion 32A in the YZ-plane similarly to the first embodiment.

Under the connected state, the engagement projection 784 of the second engagement member 70 is received in the engagement recess 422A of the flat-plate portion 42A of the first engagement member 40A. As a result, the connected state is locked. Thus, under the connected state, the engagement projection 784 and the engagement recess 422A are engaged with each other to lock the connected state. The connector assembly 10A of the present embodiment comprises a lock mechanism formed of the engagement projection 784 and the engagement recess 422A.

Referring to FIGS. 23 and 27, under the connected state where the first connector 20A and the second connector 50 are connected to each other, the first contact portions 262A of the first terminals 26A are in contact with the second contact portions 562 of the second terminals 56 at contact areas 12A, respectively. Under the connected state, the first mating portion 32A and the second mating portion 62 are fit with each other to form a mating portion 16A and entirely enclose the contact areas 12A, at each of which the first contact portion 262A and the second contact portion 562 are in contact with each other, in the YZ-plane. Thus, the present embodiment provides the connector assembly 10A which has the lock mechanism and is provided with the structure for preventing EMI similarly to the first embodiment.

Referring to FIG. 27 together with FIG. 19, when the operation portion 788 of the engagement arm 78 is pressed toward the base portion 72 under the connected state of the first connector 20A and the second connector 50, the locked state is released similarly to the first embodiment. When the second connector 50, which is released from the locked state, is moved along a removing direction (positive X-direction), the second connector 50 can be removed from the first connector 20A.

Figure 28:
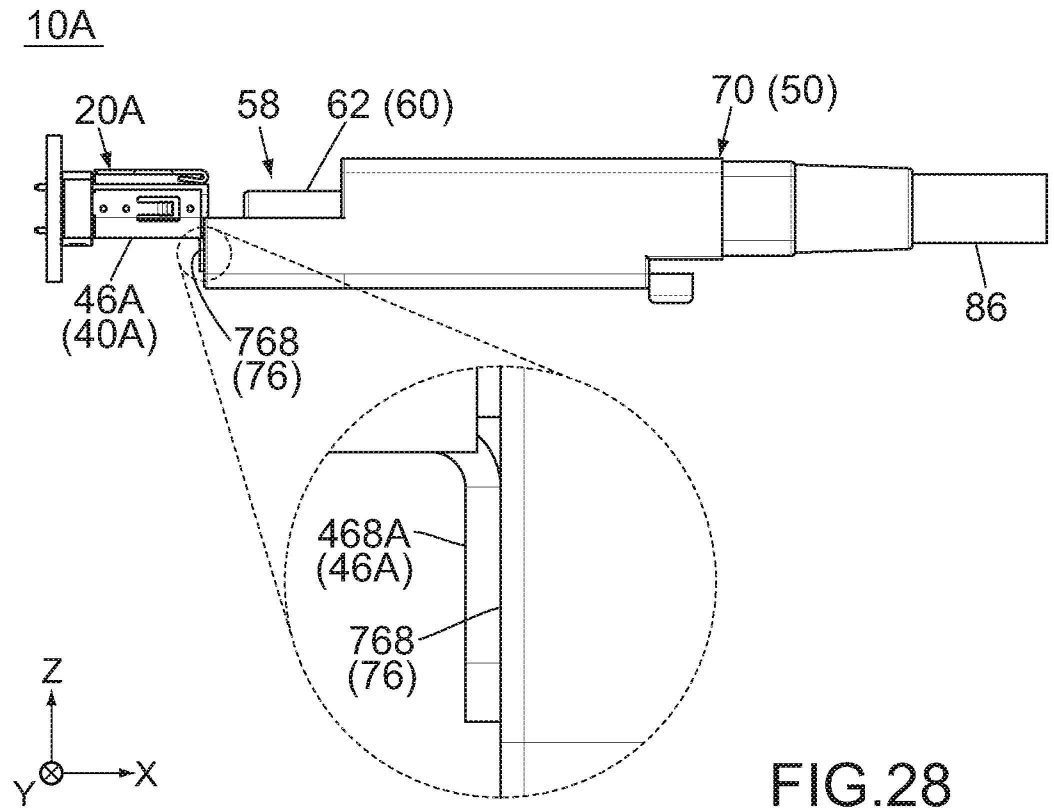
FIG. 28 is a side view showing the connector assembly of FIG. 19, wherein the second connector is arranged upside down in comparison with the second connector of FIG. 19, and a part of the connector assembly enclosed by dashed line is enlarged and illustrated.
Figure 29:
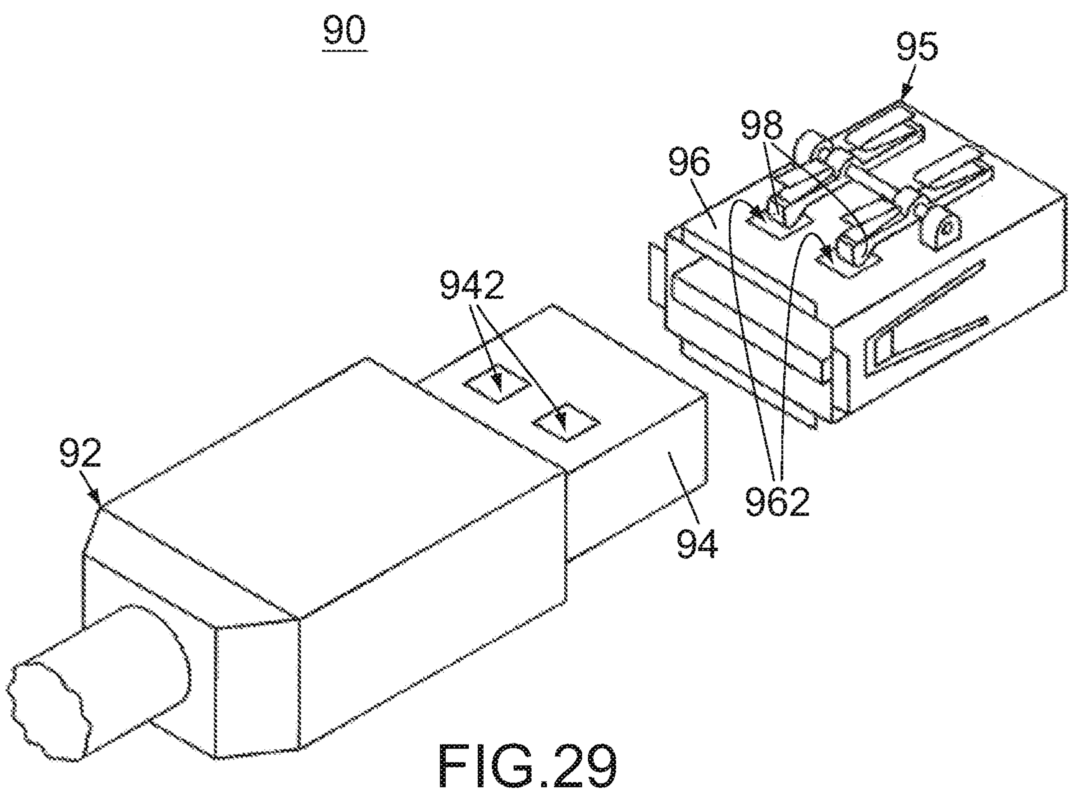
FIG.29 PRIOR ART
FIG. 29 is a perspective view showing a connector assembly of Patent Document 1.

Referring to FIGS. 25 and 27, according to the present embodiment, the receiving portion 58 of the second connector 50 partially receives the first connector 20A under the connected state. Referring to FIG. 28, if the second mating portion 62 is forced to be inserted upside down into the first mating portion 32A, the end 768 of the guide portion 76 is brought into abutment with and is stopped by the stoppers 468A of the first connector 20A. Thus, the guide portion 76 of the second connector 50 prevents reverse insertion of the second mating portion 62 into the first mating portion 32A. Moreover, because the end 768 is brought into abutment with the stoppers 468A before the contact of the second connector 50 with the first connector 20A, production of metal powder, which might be produced due to misaligned mating, can be prevented.

The second embodiment described above can be variously modified similarly to the first embodiment. Moreover, the present invention can be further variously applicable in addition to the first embodiment, the second embodiment and the various modifications described above.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A connector assembly comprising a first connector and a second connector, wherein:
- the first connector and the second connector are connectable to each other along a connection direction;
- the first connector comprises a first holding member, a plurality of first terminals, a first shell and a first engagement member;
- the first terminals are held by the first holding member;
- each of the first terminals has a first contact portion;
- the first contact portions are arranged in a lateral direction perpendicular to the connection direction;
- the first shell has a first mating portion;
- the first mating portion covers, at least in part, the first contact portions in a perpendicular plane perpendicular to the connection direction;
- the first engagement member is fixed to the first shell;
- the first engagement member is formed with an engagement recess;
- the engagement recess is located outward of the first shell in a perpendicular direction perpendicular to the connection direction;
- the second connector comprises a second holding member, a plurality of second terminals, a second shell and a second engagement member;

the second terminals are held by the second holding member;

each of the second terminals has a second contact portion;

the second shell has a second mating portion;

the second mating portion covers, at least in part, the second contact portions in the perpendicular plane;

the second engagement member covers, at least in part, the second mating portion in the perpendicular plane;

the second engagement member has an engagement projection and an engagement support portion;

the engagement projection is supported by the engagement support portion to be movable in the perpendicular direction;

the engagement projection is located outward of the second shell in the perpendicular direction and projects toward the second shell;

under a connected state where the first connector and the second connector are connected to each other, the first contact portions are in contact with the second contact portions at contact areas, respectively;

under the connected state, the first mating portion and the second mating portion are fit with each other to entirely enclose the contact areas in the perpendicular plane;

under the connected state, the engagement projection and the engagement recess are engaged with each other to lock the connected state; and the first connector and the second connector are connected to each other by moving the second connector toward the first connector along the connection direction which is perpendicular to both the lateral direction and the perpendicular direction.

2. The connector assembly as recited in claim 1, wherein:

the engagement support portion is resiliently deformable; and the engagement projection is movable in the perpendicular direction in accordance with resilient deformation of the engagement support portion.

3. The connector assembly as recited in claim 1, wherein:

each of the first shell, the first engagement member and the second shell is made of metal;

the first engagement member has a flat-plate portion;

the flat-plate portion intersects with the perpendicular direction and is apart from the first mating portion in the perpendicular direction; and the engagement recess is formed in the flat-plate portion.

4. The connector assembly as recited in claim 1, wherein:

the first engagement member is a member other than the first shell;

the first shell has an inner positioning portion;

the first engagement member has an outer positioning portion; and the inner positioning portion and the outer positioning portion are combined to each other, so that the first engagement member is positioned to the first shell.

5. The connector assembly as recited in claim 4, wherein:

the inner positioning portion is an opening formed in the first mating portion and opens inward and outward from the first mating portion in the perpendicular plane;

the outer positioning portion projects inward in the perpendicular plane; and the outer positioning portion is received in the inner positioning portion and closes, at least in part, the inner positioning portion.

6. The connector assembly as recited in claim 1, wherein the second engagement member covers only one of opposite sides of the second mating portion in the perpendicular direction.

7. The connector assembly as recited in claim 6, wherein:

when the first connector is used, the first connector is fixed on a board which extends along the perpendicular plane;

the first connector has a stopper; and the stopper is provided on only one of opposite sides of the first connector in the perpendicular direction.

8. The connector assembly as recited in claim 1, wherein:

the second engagement member has a protection portion; and the protection portion covers the engagement support portion in a predetermined plane perpendicular to the perpendicular direction.

9. The connector assembly as recited in claim 1, wherein:

the second engagement member has a guide portion; and the guide portion guides a position of the second mating portion relative to the first mating portion in the perpendicular direction while the first connector and the second connector are connected to each other.

10. The connector assembly as recited in claim 9, wherein:

the guide portion has a main guide portion and two side guide portions; and in the perpendicular plane, the main guide portion extends along a predetermined direction perpendicular to both the connection direction and the perpendicular direction, and the side guide portions extend from opposite ends of the main guide portion in the predetermined direction, respectively, and extend in parallel to each other along the perpendicular direction.

11. The connector assembly as recited in claim 9, wherein an end of the second mating portion is located between the engagement projection and an end of the guide portion in the connection direction.

* * * * *